United States Patent [19]

Koyama et al.

[11] Patent Number: 5,321,286

[45] Date of Patent: Jun. 14, 1994

[54] NON-VOLATILE SEMICONDUCTOR MEMORY DEVICE HAVING THIN FILM MEMORY TRANSISTORS STACKED OVER ASSOCIATED SELECTING TRANSISTORS

[75] Inventors: Shoji Koyama; Tatsuro Inoue, both of Tokyo, Japan

[73] Assignee: NEC Corporation, Japan

[21] Appl. No.: 978,899

[22] Filed: Nov. 19, 1992

[30] Foreign Application Priority Data

Nov. 26, 1991 [JP] Japan ............... 3-337636

[51] Int. Cl.⁵ .................. H01L 29/78; H01L 29/04
[52] U.S. Cl. ................ 257/315; 257/349; 257/314; 257/67; 257/71; 257/57; 365/185
[58] Field of Search .............. 257/315, 349, 66, 67, 257/71, 57, 314; 365/185

[56] References Cited

U.S. PATENT DOCUMENTS

| | | | |
|---|---|---|---|
| 4,630,089 | 12/1986 | Sasaki et al. | 257/66 |
| 5,038,193 | 8/1991 | Kamigaki et al. | 257/314 |
| 5,191,551 | 3/1993 | Inoue | 365/185 |
| 5,229,644 | 7/1993 | Wakai et al. | 257/59 |

FOREIGN PATENT DOCUMENTS

| | | |
|---|---|---|
| 0419663 | 4/1991 | European Pat. Off. |
| 0469554 | 2/1992 | European Pat. Off. |
| 3942171 | 6/1990 | Fed. Rep. of Germany |
| 58-56456 | 4/1983 | Japan |
| 63-283071 | 11/1988 | Japan ........ 365/185 |
| 2244767 | 9/1990 | Japan ........ 365/185 |
| 3105976 | 5/1991 | Japan ........ 257/349 |

OTHER PUBLICATIONS

*Tech. Notes RCA Bulletin* No. 1152 May 24, 1976, "Floating . . . Device" Medwin et al.
Mayer, *IEEE Trans. on Elec. Dev.* vol. 37, No. 5, May 1990, "Modes . . . Trans." pp. 1280–1288.
"A 3.6 square-micron Memory Cell Structure for 16 MB EPROMS" by IEDM 89-583 (pp. 25.2.1–25.2-3).

*Primary Examiner*—Jerome Jackson
*Attorney, Agent, or Firm*—Laff, Whitesel, Conte, Saret

[57] ABSTRACT

A electrically erasable and programmable read only memory device has a memory cell array implemented by a plurality of floating gate type memory transistors, and each of the floating gate type memory transistors is implemented by a thin film field effect transistor with a floating gate electrode formed on a relatively thick insulating film covering a major surface of a semiconductor substrate so that the biasing conditions and crystal defects do not have any influence on the floating gate type memory transistor.

1 Claim, 15 Drawing Sheets

5,321,286

NON-VOLATILE SEMICONDUCTOR MEMORY DEVICE HAVING THIN FILM MEMORY TRANSISTORS STACKED OVER ASSOCIATED SELECTING TRANSISTORS

FIELD OF THE INVENTION

This invention relates to a non-volatile semiconductor memory device and, more particularly, to a floating gate type memory transistor for storing a data bit in a rewriteable manner.

DESCRIPTION OF THE RELATED ART

Typical examples of the non-volatile semiconductor memory device are known as EPROM (Electrically Programmable Read Only Memory) and EEPROM (Electrically Erasable and Programmable Read Only Memory), and the memory transistors are of the type having a floating gate electrode on an insulating film covering a bulk semiconductor substrate.

FIG. 1 and 2 are cross sectional views showing the floating gate type memory transistor incorporated in the prior art non-volatile semiconductor memory device. FIG. 1 shows a cross section taken along the channel length, and FIG. 2 shows another cross section taken along the channel width. The floating gate type memory transistor is fabricated on a p-type semiconductor bulk substrate 1, and n-type source and drain regions 2a and 2b are formed in an active area or a surface portion of the p-type semiconductor substrate 1 defined by a thick field insulating film 3a. The n-type source and drain regions 2a and 2b are spaced apart from each other by a channel region 2c, and the p-type semiconductor bulk substrate 1 is covered with a first thin gate insulating film 3b. A floating gate electrode 4 is patterned on the first thin gate insulating film 3b, and is covered with a second thin gate insulating film 5. A control gate electrode 6 is patterned and extends on the second thin gate insulating film 5, and is covered with an inter-level insulating film 7. Thus, the floating gate type memory transistor incorporated in the prior art non-volatile semiconductor memory device is fabricated as a bulk transistor, and stores a data bit in a rewriteable manner.

The threshold level of the floating gate type memory transistor is variable depending upon electric charges accumulated in the floating gate electrode 4, and the high and low threshold levels correspond to two logic levels of a binary data bit. Namely, when accessing to the binary data bit, the control gate electrode 6 is regulated to an intermediate voltage level between the high and low threshold levels, and the floating gate type memory transistor turns on or off depending upon the threshold level thereof If the floating gate type memory transistor turns on, channel current flows therethrough, and the voltage level at the drain region 2b is decayed. On the other hand, if the floating gate type memory transistor remains off, no current flows therethrough, and the voltage level at the drain region 2b is relatively high. A large number of floating gate type memory transistors are incorporated in the non-volatile semiconductor memory device, and the threshold level of each floating gate type memory transistor is changed or maintained through a programming. The programming is carried out by selectively injecting hot electrons from the channel region 2c, and the programming using hot electrons are hereinbelow referred as "hot electron programming". Fowler-Nordheim tunneling phenomenon and avalanche break-down are also available for the programming. When the Fowler-Nordheim tunneling phenomenon takes place, tunneling current flows across the first thin gate insulating film 3, and the programming using the Fowler-Nordheim tunneling current is hereinbelow referred to as "Fowler-Nordheim programing". The avalanche break-down produces hot holes, and the programming using the hot holes is hereinbelow referred to as "hot hole programming".

As described hereinbefore, a large number of floating gate type memory transistors are incorporated in the non-volatile semiconductor memory device, and FIG. 3 shows an equivalent circuit of a memory cell array incorporated in an EEPROM. The EEPROM is called as a flash EPROM, and data stored in the EEPROM is concurrently erasable with current. However, the memory cell array incorporated in an EPROM is similar in arrangement to the EEPROM In FIG. 3, reference signs QM11, QM12, QM21 and QM22 are indicative of floating gate type memory transistors, and word lines X1 and X2 are coupled with the control gate electrodes 6 of the floating gate type memory transistors QM11 and QM12 and with the control gate electrodes 6 of the floating gate type memory transistors QM21 and QM22, respectively. Bit lines Y1 and Y2 are shared between the floating gate type memory transistors QM11/ QM21 and QM12/ QM22, and are coupled with drain regions 2b of the associated floating gate type memory transistors. Reference sign S is indicative of a source line, and is coupled with the source regions 2a of all the floating gate type memory transistors QM11 to QM22.

The prior art EEPROM thus arranged behaves as follows. The prior art EEPROM selectively enters a read-out mode, a write-in mode and an erasing mode of operation. First, description is hereinbelow made on the read-out mode of operation on the assumption that the floating gate type memory transistor QM11 is accessed The word line X1 is biased to high voltage level such as, for example, 5 volts, and the other word line X2 is maintained at low voltage level such as, for example, zero volt. The bit line Y1 is selected, and is lifted to voltage level of 1 volt. However, the other bit line Y2 enters open-state. Though not shown in FIG. 3, the selected bit line Y1 is coupled with a sense amplifier circuit, and the sense amplifier circuit monitors the voltage level on the bit line Y1 and, accordingly, the voltage level at the drain region 2b of the floating gate type memory transistor QM11. In this situation, if the threshold level of the floating gate type memory transistor QM11 is equal to or less than 5 volts, a conductive channel is produced, and current flows from the bit line Y1 through the floating gate type memory transistor QM11 to the source line S. As a result, the bit line Y1 is decayed, and the sense amplifier circuit decides that the selected memory transistor QM11 has a low threshold level. However, if the threshold level is higher than 5 volts, the floating gate type memory transistor QM11 is turned off, and no current flows into the source line S. For this reason, the bit line Y1 does not change the voltage level thereon, and the sense amplifier circuit decides that the selected memory transistor has a low threshold level. Thus, the threshold level of the selected memory transistor is represented by the voltage level at the selected bit line, and the sense amplifier circuit compares the voltage level on the selected bit line with a reference voltage for producing an output data signal indicative of the accessed binary data bit.

Subsequently, if the EEPROM enters the programming mode of operation, the selected word line X1 (or X2) is biased to 5 volts, and the other word line X2 (or X1) is maintained at zero volt. Moreover, the selected bit lines Y1 (or Y2) is lifted to 7 volts, and the other bit line Y2 (or Y1) enters the open state. The selected word line and the selected bit line are changed for sequentially selecting the floating gate type memory transistors QM11 to QM22. When the word lines X1 and X2 and the bit lines Y1 ad Y2 are regulated to the above described voltage levels, channel current flows through in only the memory transistor located at the crossing point of the selected word line X1 or X2 and the selected bit line Y1 or Y2, and hot electrons are injected into the floating gate electrode of the selected memory transistor. In this way, the hot electron programming is selectively carried out for the memory cell array.

In the erasing mode of operation, all of the word lines X1 and X2 are decayed to zero volt, and all of the bit lines Y1 and Y2 enter the open state. When extremely high voltage level such as 12 volts is applied to the source line S, electric field between the source regions 2a and the floating gate electrodes 4 becomes stronger, and the electrons accumulated in the floating gate electrodes 4 are attracted toward the source regions 2a. As a result, the accumulated electrons are discharged from the floating gate electrodes 4 to the source regions 2a as Fowler-Nordheim tunneling current, and all of the memory transistors QM11 to QM22 enter erased state. However, in case of the EPROM, ultra-violet light is radiated onto the memory cell array, and all of the memory cells are concurrently erased.

The prior art memory transistor has following structural features, and some problems inherent in the prior art memory transistor are derived from these structural features.

The first structural feature is the source and drain regions formed in the surface portions of the semiconductor bulk substrate 1, and the second structural feature is the conductive channel produced between the source and drain regions 2a and 2b in the semiconductor bulk substrate 1. Finally, the third structural feature is the isolation technology, i.e. the thick field insulating film 3a which is usually assisted by a channel stopper therebeneath.

These first to third structural features result in the following problems. Since the drain region 2b forms a p-n junction with the semiconductor bulk substrate 1 under reverse biasing, depletion layer extends from the p-n junction, and the depletion layer forms a parasitic capacitor together with the semiconductor bulk substrate 1 and the drain region 2b. The amount of parasitic capacitance coupled with the drain region 2b is depending upon the occupation area of the drain region 2b as well as the impurity concentration of the semiconductor bulk substrate 1. When the impurity concentration of the semiconductor bulk substrate 1 is assumed to be $7 \times 10^{16}$ cm$^{-3}$, the parasitic capacitance at every square-micron is about $1 \times 10^{-3}$ pF at unit drain voltage level, i,e. 1 volt. A commercial product is arranged that a large number of memory transistors are coupled with each of the bit lines Y1 and Y2, and, for this reason, the total amount of parasitic capacitance coupled with every bit line Y1 or Y2 reaches several pF. The parasitic capacitance decelerates propagation of voltage variation on the bit line Y1 or Y2. This is because of the fact that the time period for the voltage elevation is in proportion to the time constant given as the product between the resistance at a charging transistor (not shown) and the parasitic capacitance, and the time period for discharging the bit line is also in proportion to the time constant given as the product between the resistance of the memory transistor and the parasitic capacitance. In summary, the first problem inherent in the prior art memory transistor is low data access speed.

The second problem is also derived from the first structural feature, and is junction leakage current causative of an error in the data access. The semiconductor bulk substrate 1 contains unavoidable crystal defects. When the crystal defect is included into the depletion layer extending from the p-n junction between the drain region 2b and the semiconductor bulk substrate 1, leakage current flows across the depletion layer into the semiconductor bulk substrate 1. As described hereinbefore, the logic level of an accessed data bit is represented by the channel current flowing through the selected memory transistor. If the selected memory transistor allows the channel current to flow, the leakage current may not result in the error. However, if the selected memory transistor remains off, the leakage current is not ignorable, because the sense amplifier circuit coupled with the associated bit line can not discriminate the leakage current from the channel current. As a result, the selected memory cell in the erased state is mistakenly decided to be a memory transistor in the write-in state. The crystal defects are liable to take place in the vicinity of the thick field insulating film 3a, and the leakage current due to the crystal defects causes the EEPROM to be a defective product. In other words, the leakage current deteriorates the production yield.

The third problem is also derived from the first structural feature, i.e., the source region 2a formed in the surface portion of the semiconductor bulk substrate 1, and is undesirable voltage decay in the erasing mode of operation. In detail, as shown in FIG. 1, the source region 2a is formed in the semiconductor bulk substrate 1, and avalanche break-down current and leakage current tend to be concurrently produced together with the F-N tunneling current due to the extremely high voltage level at the source region 2a. The avalanche break-down current and the leakage current flows into the semiconductor bulk substrate 1. For this reason, if a charge pump (not shown) boosts the voltage level and supplies the extremely high voltage level to the source regions 2a, the voltage level at the source regions 2a are decayed due to the avalanche break-down current and the leakage current If the charge pump is too small in boosting capability to keep the extremely high voltage level at the source regions 2a, the memory transistors are hardly erased.

Another problem derived from the second structural feature, i.e., the channel region 2c assigned the surface portion of the semiconductor bulk substrate 1 is that the back gate biasing is not available for the prior art EEPROM as well as the prior art EPROM. In detail, the threshold level VTM of the memory transistors is variable depending upon the voltage level VSUB of the semiconductor bulk substrate 1, and is given as:

$$VTM = VTM0 - (4 \times \text{epsilon-si} \times \text{epsilon-0} \times q \times NA \times \text{phi-s})^{\frac{1}{2}}/Cox + (2 \times \text{epsilon-si} \times \text{epsilon-0} \times q \times NA \, (\|VSUB\| + 2 \times \text{phi-f})^{\frac{1}{2}}/Cox$$

where VTM0 is the standard threshold level under the voltage level VSUB at zero volt, epsilon-si is the permittivity of silicon, epsilon-0 is the permittivity in vacuum, q is the electric charge of electron, NA is the impurity concentration of the semiconductor bulk substrate 1, phi-f is the Fermi-level, and Cox is the capacitance across the first thin gate insulating film 3b. As will be understood from the above equation, when the semiconductor bulk substrate 1 is biased from zero volt, the threshold level VTM of the memory transistors is varied from the standard threshold level VTM0. However, the parasitic capacitance is decreased under the application of the voltage level to the substrate, and, for this reason, the back gate biasing is desirable in view of speed-up of the peripheral circuit. For this reason, the back gate biasing is generally employed in a dynamic random access memory. However, the prior art EPROM and the prior art EEPROM are larger in impurity concentration at the channel regions 2c than the dynamic random access memory device, and the threshold level VTM is widely elevated under the back gate biasing. A widely elevated threshold level is not desirable, because a higher voltage level is required for the control gate electrodes 6 in the read-out mode of operation. This means that the trade-off is unfavorable to the EPROM and the EEPROM even if the peripheral circuits are accelerated. For this reason, the back gate biasing technology is usually not employed in the EPROM and the EEPROM, and the prior art EPROM and the prior art EEPROM suffer from low speed of the peripheral circuits A problem derived from the third structural feature is undesirable penetration of the thick field insulating film 8 into the channel regions 2c called as "bird beak". While the thick field insulating film 3a is grown through a selective oxidation process such as LOCOS, the edge of the thick field insulating film 3a penetrates into the channel regions 2c, and decreases the effective channel width Moreover, narrow channel phenomenon is not ignorable, because the impurities beneath the thick field insulating film 3a are diffused into the channel regions 2c. This results in that the effective channel width becomes smaller than the channel width initially defined through the patterning stage.

SUMMARY OF THE INVENTION

It is therefore an important object of the present invention to provide a non-volatile semiconductor memory device which is free from the problems inherent in the prior art non-volatile semiconductor memory device.

To accomplish the object, the present invention proposes to form source, drain and channel regions of a floating gate type memory transistor in a semiconductor film isolated from a semiconductor bulk substrate with an insulating film.

In accordance with one aspect of the present invention, there is provided a non-volatile semiconductor memory device fabricated on a single semiconductor substrate, comprising: a) a lower insulating film over a major surface of the semiconductor substrate; and b) at least one floating gate type memory transistor having b-1) a source region formed in a semiconductor film provided on the lower insulating film, b-2) a drain region formed in the semiconductor film, and spaced apart from the source region, b-3) a channel region defined in the semiconductor film, and located between the source and drain regions, b-4) a relatively thin lower gate insulating film covering the channel region, b-5) a floating gate electrode formed on the relatively thin lower gate insulating film, b-6) a relatively thin upper gate insulating film covering the floating gate electrode, and b-7) a control gate electrode formed on the relatively thin upper gate insulating film, and located over the floating gate electrode.

In accordance with another aspect of the present invention, there is provided a non-volatile semiconductor memory device fabricated on a semiconductor substrate, comprising: a) a lower memory cell sub-array implemented by a plurality of floating gate type bulk transistors each comprising a-1) source and drain regions formed in surface portions of the semiconductor substrate, and spaced from each other by a channel region, a-2) a first gate insulating film formed on the channel region, a-3) a floating gate electrode formed on the first gate insulating film, a-4) a second gate insulating film formed on the floating gate electrode, and a-5) a control electrode formed on the second gate insulating film; b) a lower inter-level insulating film covering the lower memory cell sub-array; C) an upper memory cell sub-array fabricated on the lower inter-level insulating film, and implemented by a plurality of floating gate type thin film memory transistors each comprising c-1) source and drain regions formed in a semiconductor film extending over the lower inter-level insulating film, and spaced apart from each other by a channel region, the source and drain regions of the floating gate type thin film memory transistor being respectively held in contact with the source and drain regions of the floating gate type bulk memory transistor located thereunder, c-2) a lower gate insulating film covering the channel region, c-3) a floating gate electrode formed on the lower gate insulating film, c-4) an upper gate insulating film covering the floating gate electrode, and c-5) a control gate electrode formed on the upper gate insulating film; d) an upper inter-level insulating film structure covering the upper memory cell sub-array, and having at least one contact hole exposing the drain regions held in contact with each other; and e) at least one bit line extending on the upper inter-level insulating film, and penetrating the at least one contact hole so as to be held in contact with the drain regions.

In accordance with yet another aspect of the present invention, there is provided a non-volatile semiconductor memory device fabricated on a semiconductor substrate, comprising: a) a first selecting means implemented by a first bulk transistor comprising a-1) source and drain regions formed in surface portions of the semiconductor substrate, and spaced from each other by a first channel region, a-b) a first gate insulating film formed on the first channel region, and a-3) a first gate electrode formed on the first gate insulating film; b) a second selecting means coupled with one of the source and drain regions of the first bulk transistor, and implemented by a plurality of second bulk transistors coupled in series, each of the plurality of second bulk transistors comprising b-1) source and drain regions formed in other surface portions of the semiconductor substrate, and spaced from each other by a second channel region, b-2) a second gate insulating film formed on the second channel region, and b-3) a second gate electrode formed on the second gate insulating film, a-4) a second gate insulating film; c) a lower inter-level insulating film covering the first selecting means and the second selecting means; d) a memory cell sub-array fabricated on the lower inter-level insulating film, and implemented by a plurality of floating gate type thin film memory transistors coupled in series and respectively paired with the plurality of second bulk transistors, each of the floating gate type thin film transistors comprising d-1) source and drain regions formed in a semiconductor film extending over the lower inter-level insulating film, and spaced apart from each other by a channel region, the source and drain regions of the floating gate type thin film memory transistor being respectively held in contact with the source and drain regions of second bulk transistor paired therewith, d-2) a lower gate insulating film covering the channel region, d-3) a floating gate electrode formed on the lower gate insulating film, d-4) an upper gate insulating film covering the floating gate electrode, and d-5) a control gate electrode formed on the upper gate insulating film; e) an upper inter-level insulating film structure covering the memory cell sub-array, and having at least one contact hole exposing the other of the source and drain regions of the first bulk transistor; and f) at least one bit line extending on the upper inter-level insulating film, and penetrating the at least one contact hole so as to be held in contact with the other of the source and drain regions of the first bulk transistor.

In accordance with yet another aspect of the present invention, there is provided a non-volatile semiconductor memory device fabricated on a semiconductor substrate, comprising: a) a first selecting means implemented by a first bulk transistor comprising a-1) source and drain regions formed in surface portions of the semiconductor substrate, and spaced from each other by a first channel region, a-b) a first gate insulating film formed on the first channel region, and a-3) a first gate electrode formed on the first gate insulating film; b) a second selecting means coupled with one of the source and drain regions of the first bulk transistor, and implemented by a plurality of second bulk transistors coupled in series, each of the plurality of second bulk transistors comprising b-1) source and drain regions formed in other surface portions of the semiconductor substrate, and spaced from each other by a second channel region, b-2) a second gate insulating film formed on the second channel region, and b-3) a second gate electrode formed on the second gate insulating film, a-4) a second gate insulating film; c) a first inter-level insulating film covering the first selecting means and the second selecting means; d) a lower memory cell sub-array fabricated on the first inter-level insulating film, and implemented by a plurality of floating gate type first thin film memory transistors coupled in series and respectively paired with the plurality of second bulk transistors, each of the floating gate type first thin film transistors comprising d-1) source and drain regions formed in a first semiconductor film extending over the first inter-level insulating film, and spaced apart from each other by a third channel region, the source and drain regions of the floating gate type thin film memory transistor being respectively held in contact with the source and drain regions of second bulk transistor paired therewith, d-2) a third gate insulating film covering the third channel region, d-3) a first floating gate electrode formed on the third gate insulating film, d-4) a fourth gate insulating film covering the first floating gate electrode, and d-5) a first control gate electrode formed on the fourth gate insulating film; e) a second inter-level insulating film covering the lower memory cell sub-array; f) a third selecting means coupled with the one of the source and drain regions of the first bulk transistor, and implemented by a plurality of thin film selecting transistors coupled in series, each of the plurality of thin film selecting transistors comprising f-1) source and drain regions formed in a second semiconductor film extending on the second inter-level insulating film, and spaced apart from each other by a fourth channel region, f-2) a fifth gate insulating film formed on the fourth channel region, and f-3) a third gate electrode formed on the fifth gate insulating film; g) a third inter-level insulating film covering the third selecting means; h) an upper memory cell sub-array fabricated on the third inter-level insulating film, and implemented by a plurality of floating gate type second thin film memory transistors coupled in series and respectively paired with the plurality of thin film selecting transistors, each of the floating gate type second thin film transistors comprising h-1) source and drain regions formed in a third semiconductor film extending over the third inter-level insulating film, and spaced apart from each other by a fifth channel region, the source and drain regions of the floating gate type second thin film memory transistor being respectively held in contact with the source and drain regions of the thin film selecting transistor paired therewith, h-2) a sixth gate insulating film covering the fifth channel region, h-3) a second floating gate electrode formed on the sixth gate insulating film, h-4) a seventh gate insulating film covering the second floating gate electrode, and h-5) a second control gate electrode formed on the seventh gate insulating film; i) a fourth inter-level insulating film covering the upper memory cell sub-array, at least one contact hole projecting through the first, second, third and fourth inter-level insulating films for exposing the other of the source and drain regions of the first bulk transistor; and j) at least one bit line extending on the fourth inter-level insulating film, and penetrating the at least one contact hole so as to be held in contact with the other of the source and drain regions of the first bulk transistor.

BRIEF DESCRIPTION OF THE DRAWINGS

The feature and advantages of the non-volatile semiconductor memory device according to the present invention will be more clearly understood from the following description taken in conjunction with the accompanying drawings in which.

DESCRIPTION OF THE PREFERRED EMBODIMENTS

Structure of Floating Gate Type Memory Transistor

First Example

Figure 4:
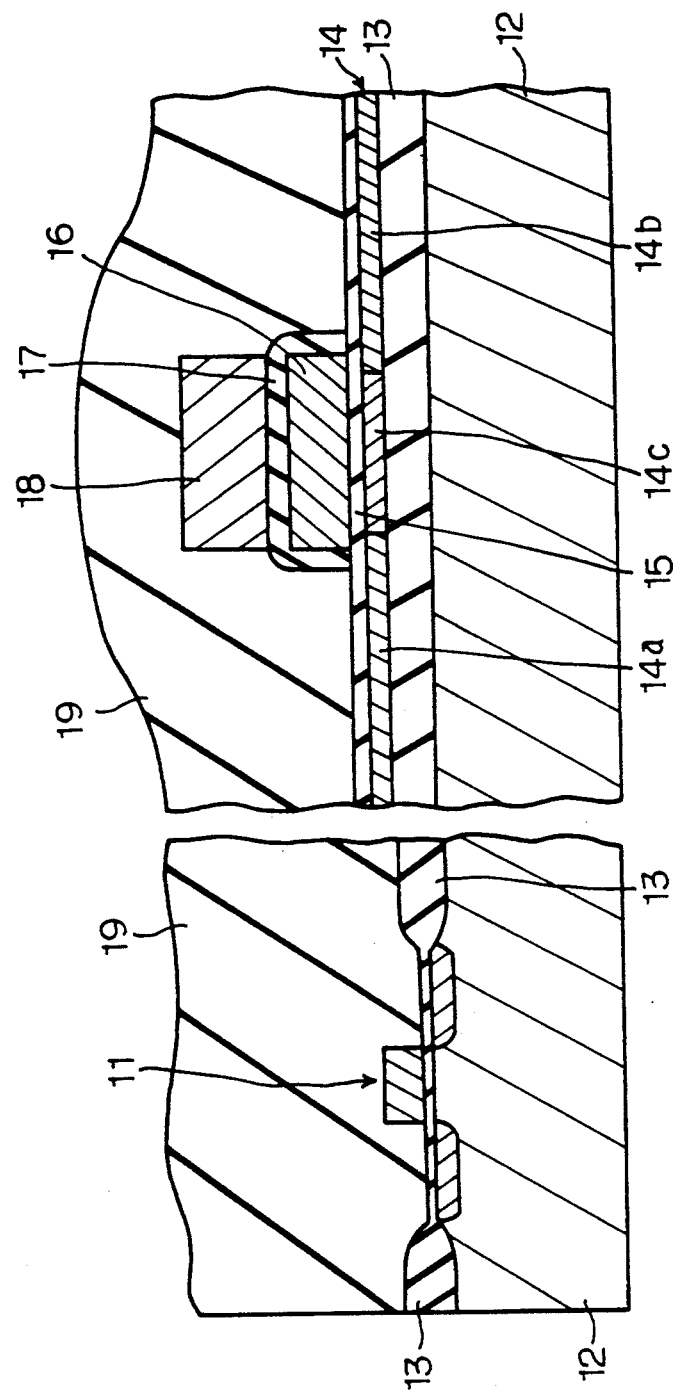
FIG. 4 is a cross sectional view showing the structure a floating gate type memory transistor according to the present invention.
Figure 5:
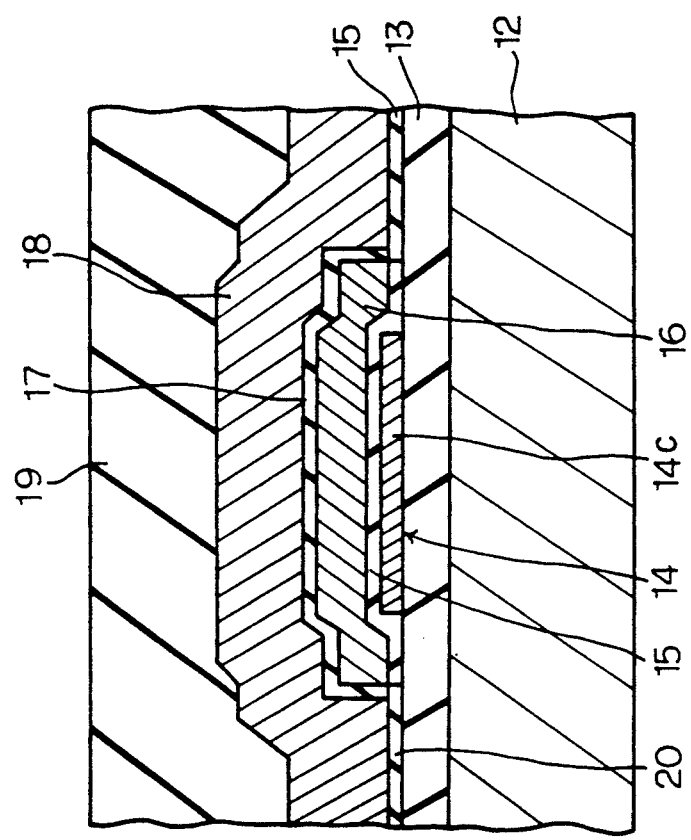
FIG. 5 is a cross sectional view showing the structure of the floating gate type memory transistor from different angle from FIG. 4.

Referring first to FIGS. 4 and 5 of the drawings, a floating gate type memory transistor implementing the present invention is implemented by a thin film transistor. FIG. 4 shows a cross section taken along a source-to-drain current path, and FIG. 5 shows a cross section different from that shown in FIG. 4 at 90 degrees. The floating gate type memory transistor is incorporated in a memory cell array forming a part of an EEPROM, and is assisted by peripheral circuits. Although only one component field effect transistor 11 is illustrated in FIG. 4, the peripheral circuits are fabricated from a plurality of circuit components including the field effect transistor 11, and the field effect transistor 11 is of the bulk transistor. However, FIG. 4 does not show actual transistor size of the field effect transistor 11.

The EEPROM is fabricated on a p-type silicon substrate 12, and the p-type silicon substrate 12 is doped at $1 \times 10^{15}$ cm$^{-3}$. A relatively thick field oxide film 13 of silicon oxide is selectively grown on the major surface of the p-type silicon substrate 12, and is as thick as 5000 angstroms. An amorphous silicon film 14 is patterned on the thick field oxide film 13, and the amorphous silicon film 14 is 400 angstroms in thickness. The source and drain regions 14a and 14b are formed in the amorphous silicon film 14, and are spaced apart from each other by a channel region 14c. The source and drain regions 14a and 14b are doped with arsenic atoms at $1 \times 10^{21}$ cm$^{-3}$, and the channel region 14c is doped with boron atoms at $5 \times 10^{16}$ cm$^{-3}$. The amorphous silicon film 14 is covered with a relatively thin lower gate oxide film 15 of silicon dioxide, and the relatively thin lower gate oxide film 15 is grown to 250 angstroms thick through a vapor phase deposition process. On the relatively thin lower gate oxide film 15 is formed a floating gate electrode 16 of polysilicon which is doped with phosphorus atoms at $5 \times 10^{20}$ cm$^{-3}$ and 1500 angstroms in thickness. The floating gate electrode 16 is covered with an upper level composite gate insulating film structure 17, and the upper level composite gate insulating film structure 17 is implemented by a silicon nitride film sandwiched between silicon dioxide films. Each of the silicon dioxide films are grown through a vapor phase deposition process to thickness of 50 angstroms, a silicon nitride film is grown to thickness of 70 angstroms. On the upper level composite gate insulating film structure 17 is patterned a control gate electrode 18 of polysilicon which is as thick as 3000 angstroms and doped with phosphorus at $1 \times 10^{21}$ cm$^{-3}$. The control gate electrode 18 is covered with an inter-level insulating film 19 of boro-phosphosilicate glass as thick as 7000 angstroms, and metal wiring strips (not shown) extend over the inter-level insulating film 19.

As will be seen from FIG. 5, composite insulating film structure 20 is provided between the relatively thick field oxide film 13 and the lower surface of the control gate electrode 18, and the composite insulating film structure 20 has the three level structure as similar to the upper composite insulating film structure 17.

The floating gate type memory transistor thus arranged is featured by the source, drain and channel regions 14a, 14b and 14c formed in the amorphous silicon film 14 on the relatively thick field oxide film 13. The relatively thick field oxide film 13 perfectly isolates the channel region 14c from the p-type silicon substrate 12, and maintains the channel region 14c in the floating state in terms of the biasing voltage level of the p-type silicon substrate 12. The present inventors discovered that the potential level in the channel region 14c was controllable with electric field from the gate electrode in so far as the channel region 11 or the semiconductor thin film was not greater than 700 angstroms, and the read-out mode, the programming mode and the erasing mode operation were performable on the floating gate type memory transistor according to the present invention as similar to the prior art floating gate type memory transistor implemented by the bulk transistor.

Description is made on advantages of the floating gate type memory transistor shown in FIGS. 4 and 5. The first advantage is reduction of parasitic capacitance coupled with the drain region 14b by virtue of the thick field insulating film 13. For example, when the thick field insulating film 13 is as thick as 5000 angstroms, the parasitic capacitance at 1 square-micron is about $1 \times 10^{-4}$ pF at unit drain voltage level, and is a tenth of the parasitic capacitance coupled with the drain region 2b of the prior art floating gate type memory transistor. This results in that the total parasitic capacitance coupled with each bit line is drastically decreased, and the drain voltage level is variable at high speed. In other words, the floating gate type memory transistor implemented by the thin film transistor can achieve high data access speed.

The second advantage is elimination of junction leakage current from the source and drain regions 14a and 14b into the p-type silicon substrate 12. The source and drain regions 14a and 14b are not isolated from the p-type silicon substrate 12 by the p-n junctions, and crystal defects are not causative of the junction leakage current. Since the leakage current from the drain region 14b is drastically decreased, the voltage level at the drain region 14b exactly indicates the threshold level of the selected floating gate type memory transistor, and an error output data signal is never produced by an associated sense amplifier circuit. This results in that the production yield is enhanced.

The third advantage of the present working example is that avalanche break-down current and leakage current only flow into the bit line even if avalanche break-down and channel leakage take place in the erasing operation, because the amorphous silicon film 14 is not associated with any back gate. If the bit lines is kept in the open state, only the Fowler-Nordheim tunneling current flows, and a charge pump coupled with the source region 14a effectively erases the selected floating gate type memory transistor.

The fourth advantage is that the back gate biasing technology is available for the component field effect transistors such as the component transistor 12, and the peripheral circuits are operable at higher speed. The thick field oxide film 13 isolates the channel region 14c from the p-type silicon substrate 12, and the channel region 14c is less affectable by the potential level in the p-type silicon substrate 12. The potential level in the channel region 14c is mostly under the influence of the control gate electrode 18. For this reason, even if the p-type silicon substrate 12 is negatively biased, the negatively biased p-type silicon substrate 12 does not elevate the threshold level of the floating gate type memory transistor. As a result, even if the control gate electrode is not excessively boosted, the channel current is much enough to allow the associated sense amplifier circuit to decide the logic level of the stored data bit. The back gate biasing technology effectively decreases parasitic capacitances coupled with the component field effect transistors of the peripheral circuits as described hereinbefore, and signal propagation are accelerated. As a result, the peripheral circuits are improved in operation speed without sacrifice of the threshold level of the floating gate type field effect transistor.

The fifth advantage is easy isolation from other memory transistors. If the floating gate type memory transistor is implemented by a bulk transistor as similar to the prior art, the relatively thick field insulating film 13 is selectively grown on the bulk substrate through complex selective oxidation process, and channel stoppers are necessary for preventing the bulk transistor from parasitic channel. However, the floating gate type memory transistor according to the present invention is implemented by a thin film transistor, and the composite insulating film structure 20 isolates the floating gate type memory transistor from the other memory transistors. The composite insulating film structure is easily fabricated through vapor phase deposition, and no channel stopper is required.

The sixth advantage is exact dimensions. As hereinbefore, a bird beak tends to take place at the edge of the thick field oxide film 13, and effective channel width is decreased by the bird beak. However, the deposition process for the complex insulating film structure never produces the bird beak, and the effective channel width is equal to the channel region 14c determined by the patterning stage of the amorphous silicon film. Moreover, it is not necessary to introduce impurities for forming a channel stopper, and the narrow channel effect does not take place.

The seventh advantage is that the side walls of the amorphous silicon film 14 are available for conductive channel, and the floating gate type memory transistor is scaled down in view of occupation area on the real estate.

Second Example

Figure 6:
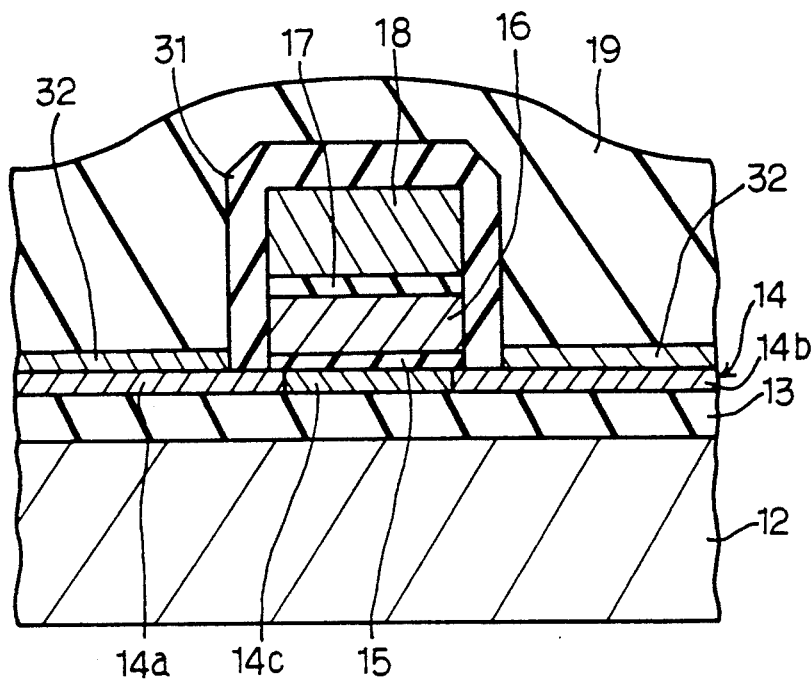
FIG. 6 is a cross sectional view showing the structure of another floating gate type memory transistor according to the present invention.
Figure 7:
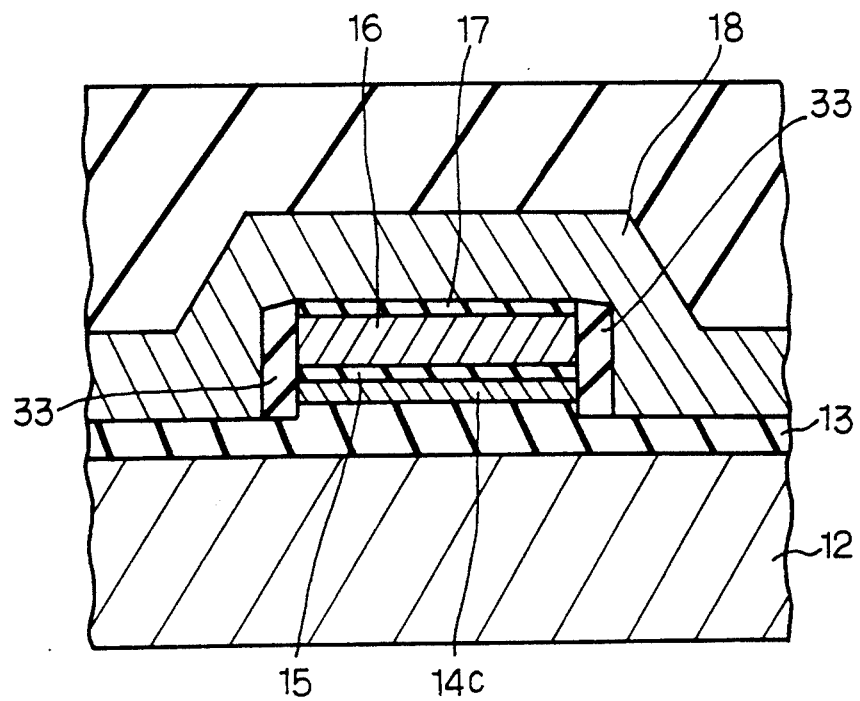
FIG. 7 is a cross sectional view showing the structure of another floating gate type memory transistor from different angle from FIG. 6.

Turning to FIGS. 6 and 7 of the drawings, the structure of another n-channel floating gate type memory transistor embodying the present invention is also implemented by a thin film transistor. FIG. 6 shows a cross section in a direction of channel length taken along the source-to-drain path, and FIG. 7 shows a cross section in a direction of channel width different from FIG. 6 at 90 degrees. The structure of the floating gate type memory transistor implementing the second embodiment is similar to the first embodiment except for some structural differences, and description is made on the differences only for the sake of simplicity. Components of the second embodiment are designated by the same references as the corresponding components of the first embodiment without detailed description.

Description is hereinbelow made on the differences. A protective silicon oxide film 31 covers the control gate electrode 18 and the floating gate electrode 16, and the amorphous silicon film 14 is partially laminated with a refractory metal silicide film 32 of $TiSi_2$. The refractory metal silicide film 32 aims at reduction of resistance, and is as thick as 1000 angstroms. Protective silicon oxide films 33 further cover the side walls of the floating gate electrode 16 as well as side walls of the channel region 14c, and is as thin as 0.3 micron. The protective silicon oxide films 33 aim at preventing the channel region 14c from leakage due to the electric field produced by the control gate electrode 6.

The protective silicon oxide films 31 and 33 and the refractory metal silicide film 32 are produced through the following process sequence. An amorphous silicon film is deposited on the thick field oxide film 13, and channel doping is carried out for the channel region 15. A silicon dioxide film and a polysilicon film are successively deposited on the amorphous silicon film, and are patterned through lithographic techniques using a mask layer provided on the polysilicon film. The mask layer on the polysilicon film allows the amorphous silicon film 14 and the floating gate electrode 16 to be aligned with each other. After the doping stage for the source and drain regions, deposition techniques followed by an etching technique are repeated, and the protective silicon oxide films 33, the composite upper gate insulating film structure 17 and the control gate electrode 18 are formed. Silicon dioxide is deposited over the entire surface of the structure, and an etch-back technique is applied to the silicon dioxide film. Namely, the silicon dioxide film is uniformly and anisotropically etched without any mask layer, and the protective silicon oxide film 31 is left on the entire surface of the control gate electrode 18 and the side surfaces of the floating gate electrode 16. After the formation of the protective silicon oxide film 31, a titanium target is sputtered so that the source and drain regions 14a and 14b in the amorphous silicon film 14 are covered with a titanium film, and the titanium film is then annealed in an appropriate high temperature atmosphere. The titanium is converted into refractory metal silicide, and non-reacted titanium is removed in alkaline solution. Then, the refractory metal silicide film 32 is left on the amorphous silicon film 14 except for that beneath the protective silicon dioxide film 31 as well as the lower gate oxide film 15.

The floating gate type memory transistor implementing the second embodiment achieves all the advantages of the first embodiment. Moreover, the second embodiment has additional structural features, and the additional structural features achieve inherent advantages. In detail, the first feature of the second embodiment is the source and drain regions 14a and 14b formed in the multi-level structure of the amorphous silicon film 14 laminated with the refractory metal silicide film 32. BY virtue of the first feature, the channel current is not decreased because of the refractory metal silicide film 32. If the channel length is adjusted to 0.5 micron, the amorphous silicon film 14 is regulated to less than 400 angstroms in thickness for restricting the short channel effect. This results in increase of the channel resistance. However, the refractory metal silicide film 32 prevents the source and drain regions 14a and 14b from the increase of the resistance.

The second feature is that the floating gate width and the channel width are determined in a self-aligned manner. By virtue of the second feature, the second embodiment is desirable for miniaturization as well as high integration density rather than the first working example, because the amorphous silicon film 14 overlaps the floating gate electrode 16 without any margin.

STRUCTURE AND ARRANGEMENT OF MEMORY CELL ARRAY

First Example

Figure 8:
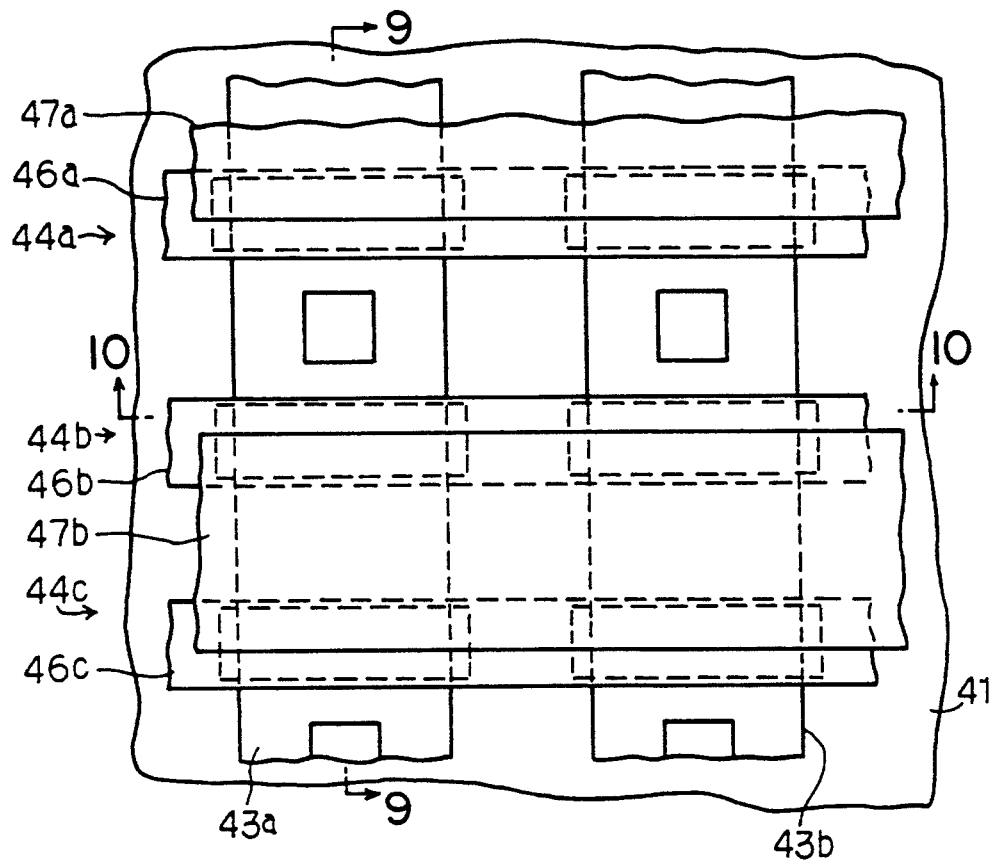
FIG. 8 is a plan view showing the layout of a memory cell array according to the present invention.
Figure 9:
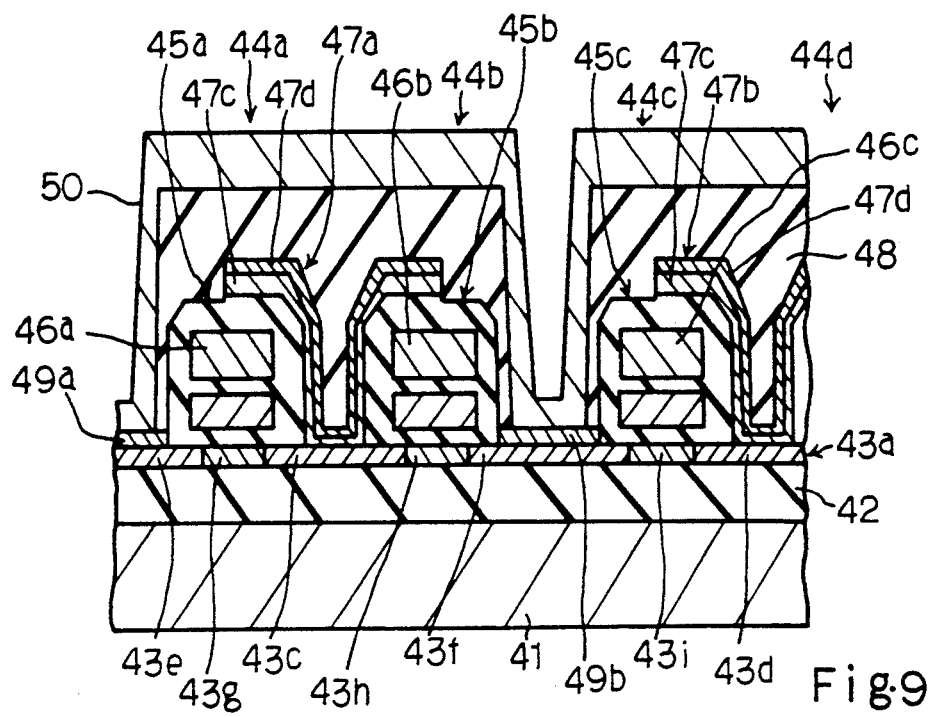
FIG. 9 is a cross sectional view taken along line 9—9 and showing the structure of the memory cell array shown in FIG. 8.
Figure 10:
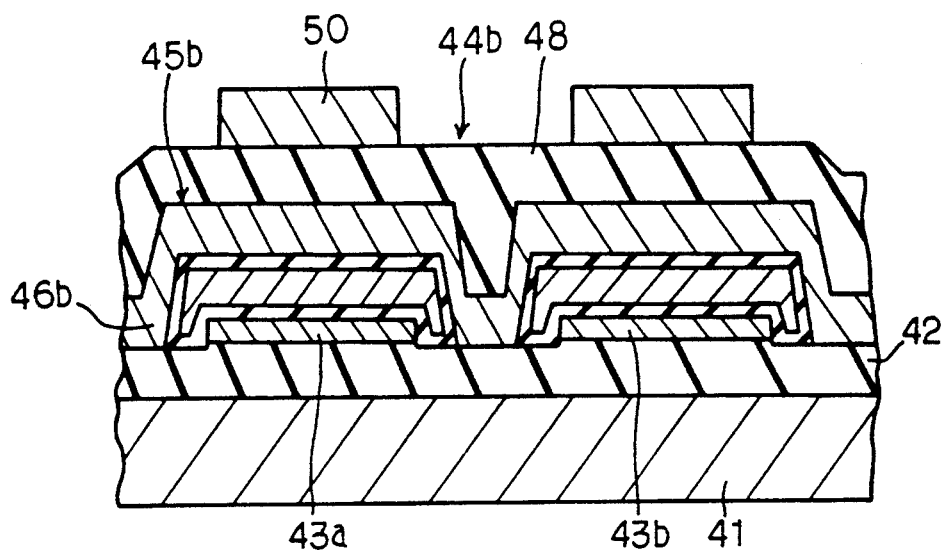
FIG. 10 is a cross sectional view taken along line 10—10 and showing the structure of the memory cell array from a different angle.

Turning to FIGS. 8 to 10 of the drawings, a memory cell array embodying the present invention is fabricated from the floating gate type memory transistors implementing either embodiment, and the memory cell array forms a part of an EEPROM. FIG. 8 shows relative relation between floating gate electrodes, control gate electrodes forming parts of word lines, amorphous silicon films and a source line, and other component films such as inter-level insulating films are deleted therefrom for the sake of simplicity. Although the memory cell array is assisted by peripheral circuits such as address decoders, an internal boosting circuit and a sense amplifier circuit, the peripheral circuits are not shown in FIGS. 8 to 10; however, description will refer to the peripheral circuits.

The EEPROM according to the present invention is fabricated on a p-type silicon substrate 41, and a thick field oxide film 42 is selectively grown on the major surface of the p-type silicon substrate 41. Most of the component field effect transistors of the peripheral circuits are of a bulk transistor having source and drain regions in surface portions of the p-type silicon substrate 41. On the thick field oxide film 41 extend a plurality of thin silicon films 43a and 43b each of which is shared between a plurality of n-channel floating gate type memory transistors. Only the floating gate type memory transistors associated with the thin silicon film 43a are described hereinbelow, and the other floating gate type memory transistors will be analogous therefrom.

Every two floating gate type memory transistors 44a/44b and 44c/44d share a source region 43c or 43d, and every drain region 43e or 43f is shared between different two floating gate type memory transistors such as 44b and 44c. The source regions 43c and 43d are respectively spaced apart from the drain regions 43e and 43f by channel regions 43g, 43h and 43i, and the source regions 43c and 43d, the drain regions 43e and 43f and the channel regions 43g, 43h and 43i occupy respective areas in the thin silicon film 43a. The channel regions 43g, 43h and 43i are respectively associated with the floating gate type memory transistors 44a, 44b and 44c, and gate structures 45a, 45b and 45c are provided on the channel regions 43g, 43h and 43i, respectively. Each of the gate structures 45a to 45c comprises a lower thin gate oxide film held in contact with the associated channel region 43g, 43h or 43i, a floating gate electrode on the lower thin gate oxide film, an upper thin gate insulating film structure on the floating gate electrode, and a control electrode on the upper thin gate insulating film structure, and a protective silicon oxide film may cover the control and floating gate electrodes. The control gate electrodes of the memory transistors respectively form parts of polysilicon strips 46a, 46b and 46c extending in perpendicular to the thin silicon films 43a and 43b, and the polysilicon strips 46a to 46c serve as word lines respectively assigned row addresses. However, the gate structure has been described under "Structure of Floating Gate Type Memory Transistor", and, for this reason, no further description is hereinbelow incorporated for avoiding repetition.

The source regions 43c and 43d are held in contact with source lines 47a and 47b through respective contact holes formed in an inter-level insulating film structure 48, and the source lines 47a and 47b extend in perpendicular to the thin silicon films 43a and 43b. The inter-level insulating film structure 48 has a boro-phosphosilicate glass film. Each of the source lines 47a and 47b has a laminated structure implemented by a polysilicon film 47c of 1000 angstroms thick doped with phosphorus and a titanium silicide film 47d of 1000 angstroms. Prior to sputtering a titanium target for the source lines 47a and 47b, silicon dioxide is removed for exposing the drain regions 43e and 43f, and the drain regions 43e and 43f are covered with titanium. The titanium on the drain regions 43e and 43f is converted into titanium silicide films 49a and 49b through an annealing stage. Thus, the titanium silicide films 47d for and the titanium silicide films 49a and 49b are concurrently produced for the low resistive source lines 47a and 47b as well as for ohmic contact with the drain regions 43e and 43f.

The inter-level insulating film structure 48 further has contact holes exposing the titanium silicide films 49a and 49b, and one of metallic wirings 50 of aluminum is with 1.0 micron width are brought into contact with the titanium silicide films 49a and 49b. The metallic wirings are 1.0 microns in width, and serve as bit lines.

Figure 23:
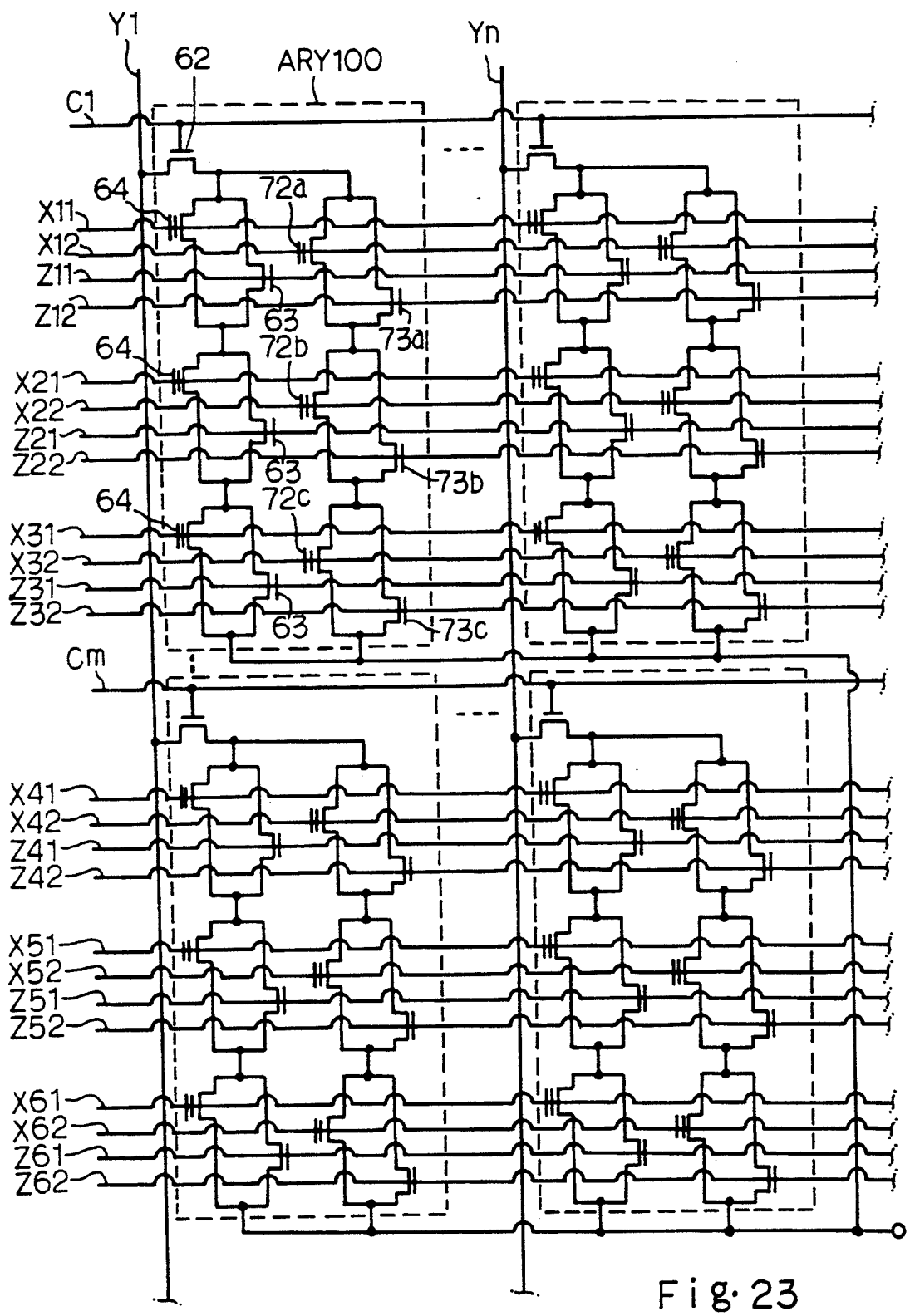
FIG. 23 is an equivalent circuit diagram showing the still another memory cell array.

The equivalent circuit diagram of this instance is similar to that shown in FIG. 23, and the circuit behaviors of the present embodiment are identical with the prior art. However, the floating gate type memory cells are advantageous over the prior art memory cells implemented by the bulk transistors.

Second Example

Figure 11:
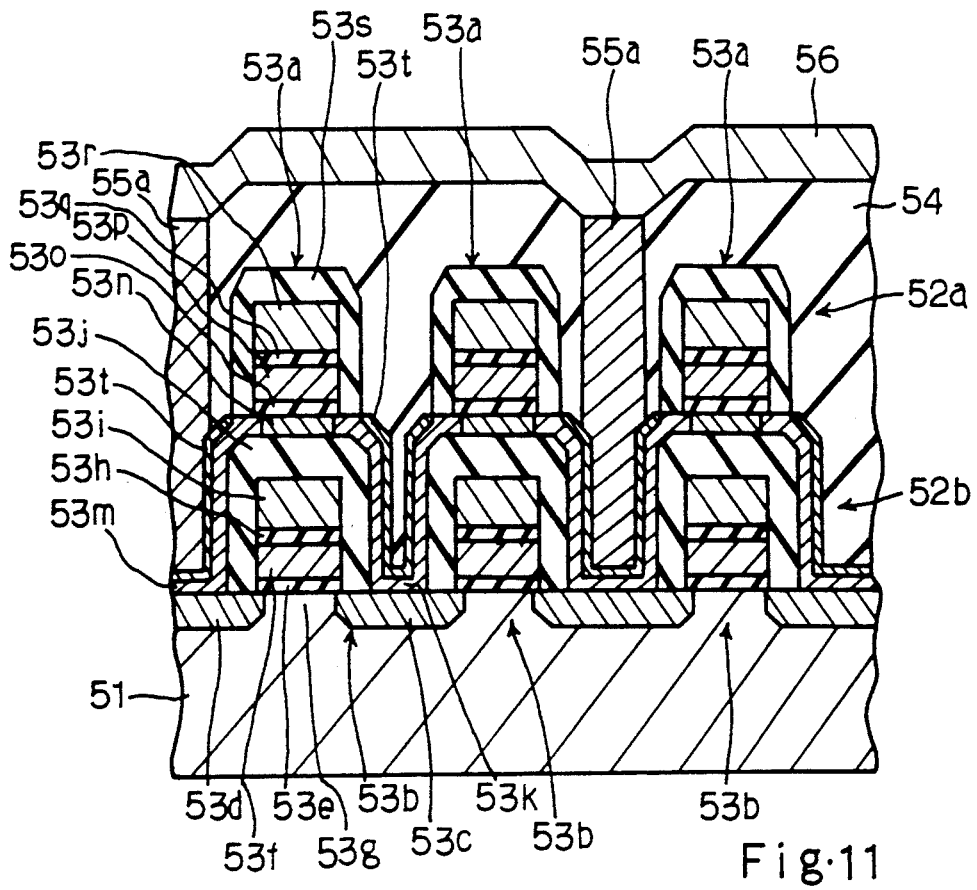
FIG. 11 is a cross sectional view showing the structure of another memory cell array according to the present invention.
Figure 12:
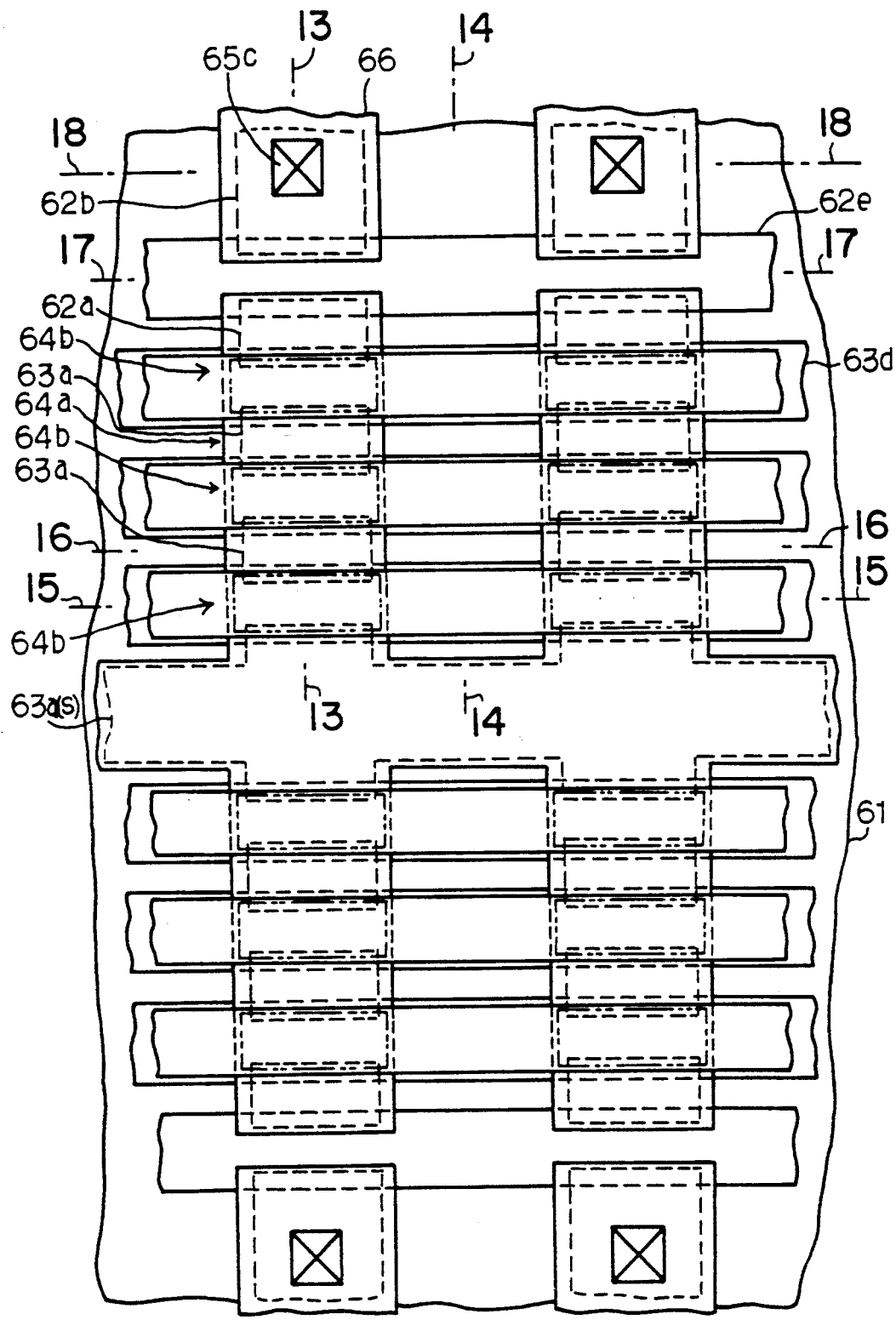
FIG. 12 is a plan view showing the layout of yet another memory cell array according to the present invention.
Figure 13:
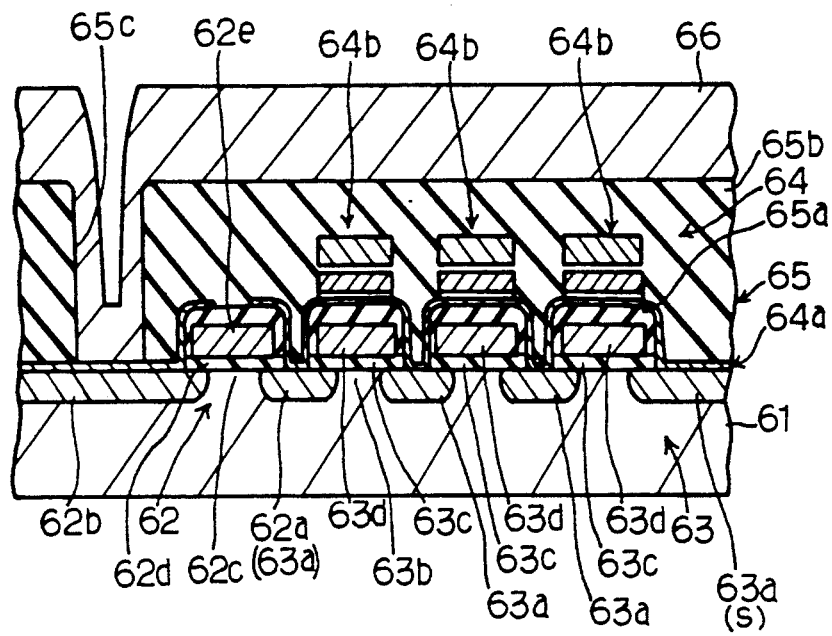
FIG. 13 is a cross sectional view taken along line 13—13 of FIG. 12 and showing the structure of the yet another memory cell array.
Figure 14:
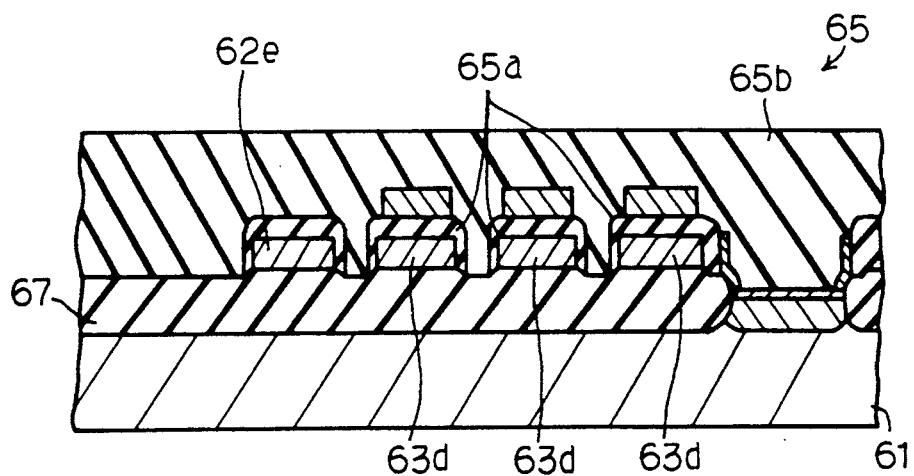
FIG. 14 is a cross sectional view taken along line 14—14 of FIG. 12 and showing the structure of the yet another memory cell array from different angle.
Figure 15:
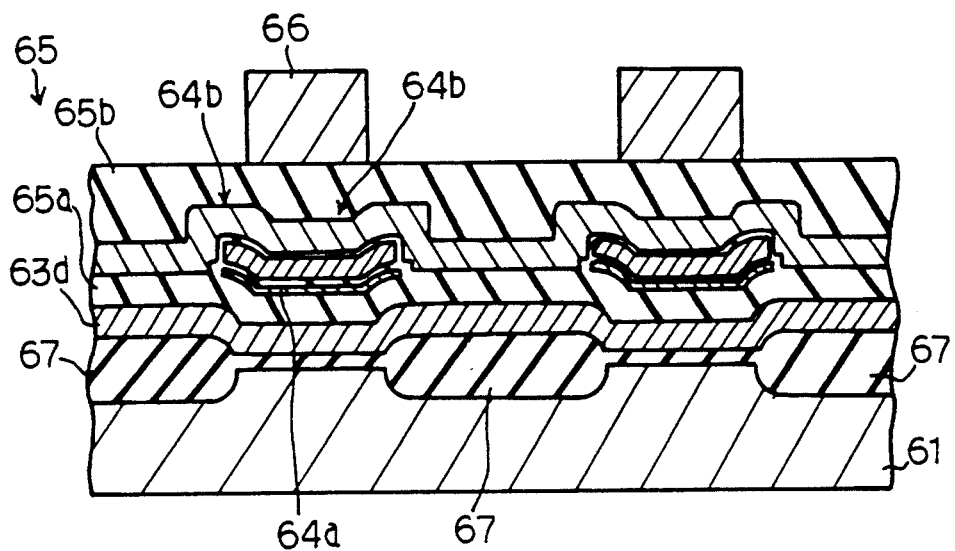
FIG. 15 is a cross sectional view taken along line 15—15 of FIG. 12 and showing the structure of the yet another memory cell array from different angle.
Figure 16:
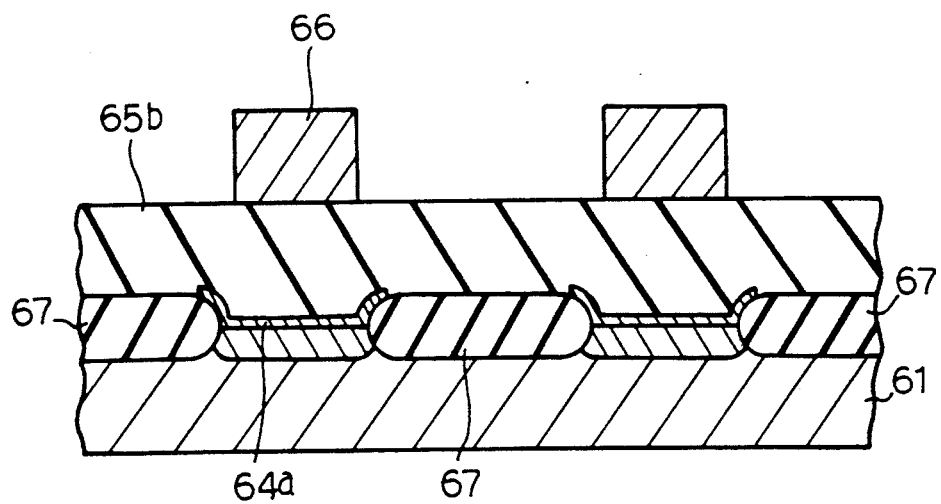
FIG. 16 is a cross sectional view taken along line 16—16 of FIG. 12 and showing the structure of the yet another memory cell array from different angle.
Figure 17:
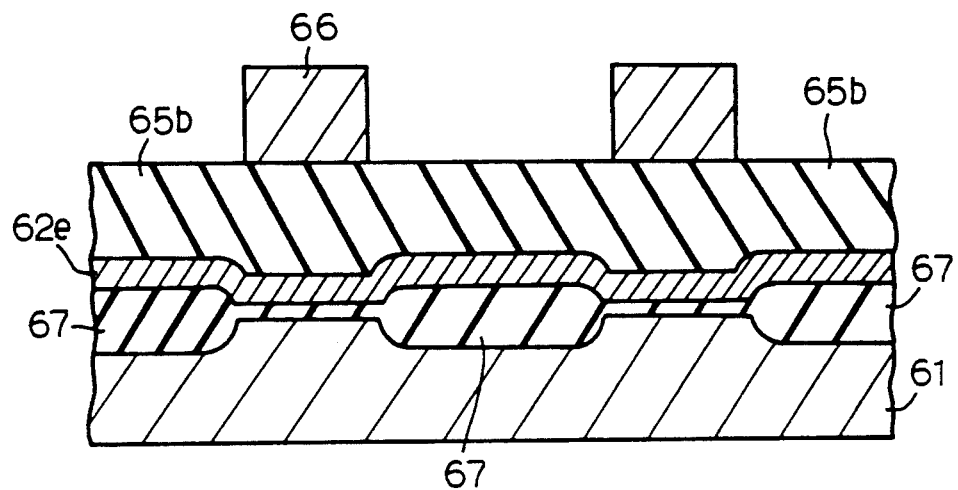
FIG. 17 is a cross sectional view taken along line 17—17 of FIG. 12 and showing the structure of the yet another memory cell array from different angle.
Figure 18:
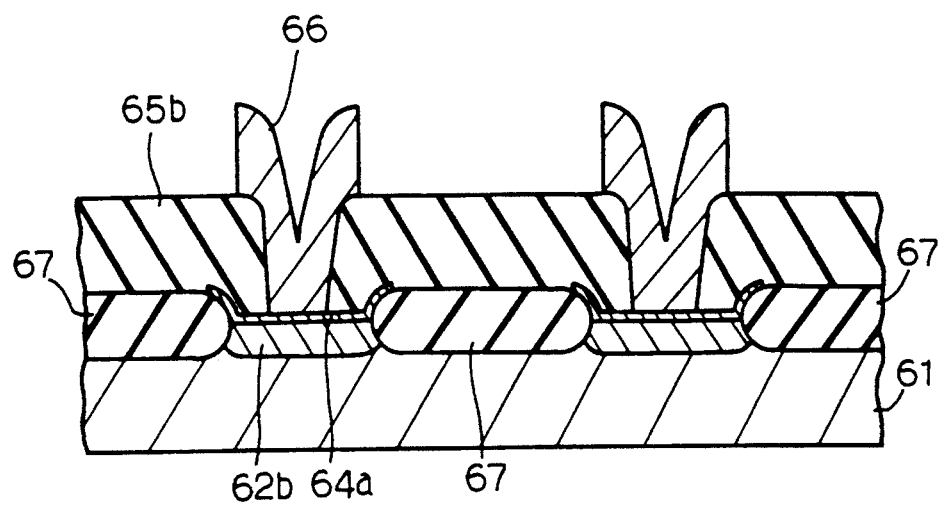
FIG. 18 is a cross sectional view taken along line 18—18 of FIG. 12 and showing the structure of the yet another memory cell array from different angle.

Turning to FIG. 11 of the drawings, another memory cell array embodying the present invention is fabricated on a p-type silicon substrate 51, an FIG. 11 shows a cross section taken along a line parallel to the source-to-drain current path thereof. A feature of the present example is directed to a stacked structure of memory cell array, and an upper memory cell sub-array 52a implemented by floating gate type thin film memory transistors 53a is stacked on a lower memory cell sub-array 52b implemented by floating gate type bulk memory transistors 53b.

Each of the floating gate type bulk memory transistors 53b comprises a source region 53c and a drain region 53d both formed in source portions of the p-type silicon substrate 51, and the source and drain regions 53c and 53d are ion implanted with arsenic atoms at dose of, for example, $5 \times 10^{15}$ cm$^{-2}$. The source region 53c is shared between the adjacent two floating gate type bulk memory transistors 53b, and one of the adjacent two floating gate type bulk memory transistors 53b shares the drain region 53d with another adjacent floating gate type bulk memory transistor 53b. The floating gate type bulk transistor 53b further comprises a first gate insulating film 53e of silicon oxide as thin as 250 angstroms, a floating gate electrode 53f formed from a polysilicon film of 1500 angstroms thick and doped with phosphorus, and the first gate insulating film 53e and the floating gate electrode 53f are in registry with each other over an associated channel region 53g between the source and drain regions 53c and 53d. A second composite gate insulating film structure 53h covers the top surface of the floating gate electrode 53f, and is constituted by a silicon nitride film of 70 angstroms thick sandwiched between silicon dioxide films each 50 angstroms thick. On the second composite gate insulating film structure 53h is provided a control gate electrode 53i which is constituted by a polysilicon film of 1500 angstroms thick doped with phosphorus and a tungsten silicide film of 1500 angstroms thick. A protective silicon oxide film 53j of 300 angstroms thick covers the gate structure, i.e., the first gate insulating film 53e, the floating gate electrode 53f, the second composite gate insulating film structure 53h and the control gate electrode 53i, and isolates the floating gate type bulk memory transistor 53b from the floating gate type thin film memory transistor 53a stacked thereon.

Each of the floating gate type thin film memory transistors 53a comprises source and drain regions 53k and 53m both formed in an amorphous silicon film of 300 angstroms thick and ion implanted with arsenic atoms at dose of $1 \times 10^{15}$ cm$^{-2}$, and a p-type channel region 53n formed in the amorphous silicon film and ion implanted with boron atoms at dose of $1 \times 10^{12}$ cm$^{-2}$. The source region 53k is shared between the adjacent two floating gate type thin film memory transistors 53a, and one of the adjacent two floating gate type thin film memory transistors 53a shares the drain region 53m with another adjacent floating gate type thin film memory transistor 53a. The channel region 53n is covered with a lower gate insulating film 53o which is grown to, for example, thickness of 250 angstroms through a high-temperature vapor phase deposition process. The lower gate insulating film 53o is overlain by a floating gate electrode 53p which in turn is overlain by an upper composite gate insulating film structure 53r. A control gate electrode 53r overlaps the upper composite gate insulating film structure 53q, and the floating gate electrode 53p, the upper composite gate insulating film structure 53q and the control electrode 53r are similar to those of the floating gate type bulk memory transistor 53b. A protective silicon oxide film of 2000 angstroms thick 53s covers the gate structure of the floating gate type thin film memory transistor 53a, and prevents the control gate electrode 53r from silicidation while the source and drain regions 53k and 53m are partially converted into titanium silicide 53t. An inter-level insulating film structure 54 further covers the upper and lower memory cell sub-arrays 52a and 52b, and contains a boro-phosphosilicate glass film. The boro-phosphosilicate glass film creates a smooth top surface of the inter-level insulating film structure 54.

The floating gate type thin film memory transistors of the upper memory cell sub-array 52a are arranged in such a manner that the source and drain regions 53k and 53m are respectively held in contact with the source and drain regions 53c and 53d of the associated floating gate type bulk memory transistors 53b. Moreover, contact holes exposing the source and drain regions 53k and 53m are formed in the inter-level insulating film structure 54, and tungsten blocks 55a fill the contact holes through a selective vapor phase deposition process. The tungsten blocks 55 interconnect a metallic wiring 56 and the drain regions 53m and, accordingly, 53d.

Figure 1:
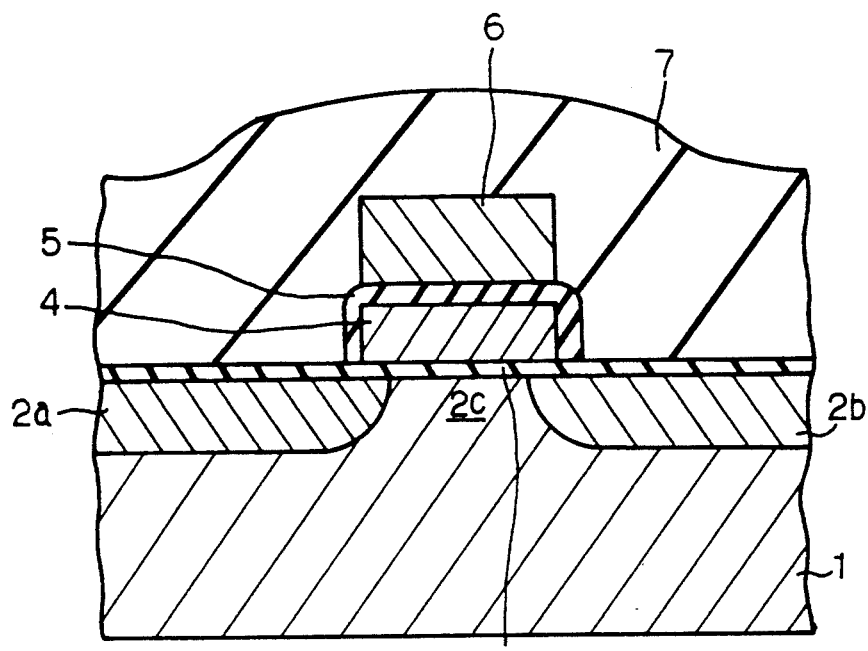
FIG. 1 is a cross sectional view showing the structure of the prior art floating gate type memory transistor.
Figure 2:
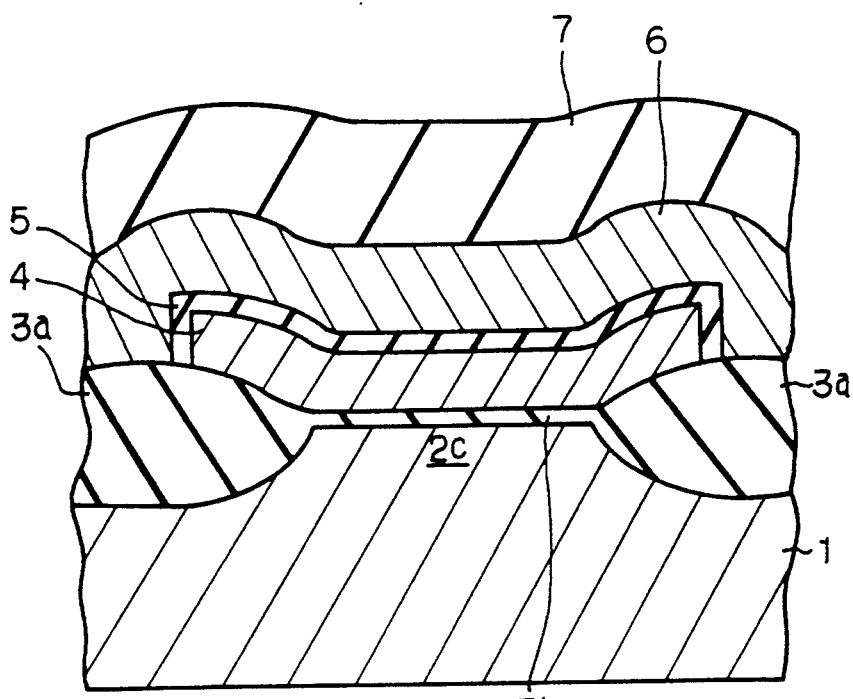
FIG. 2 is a cross sectional view showing the structure of the prior art floating gate type memory transistor from another angle.
Figure 3:
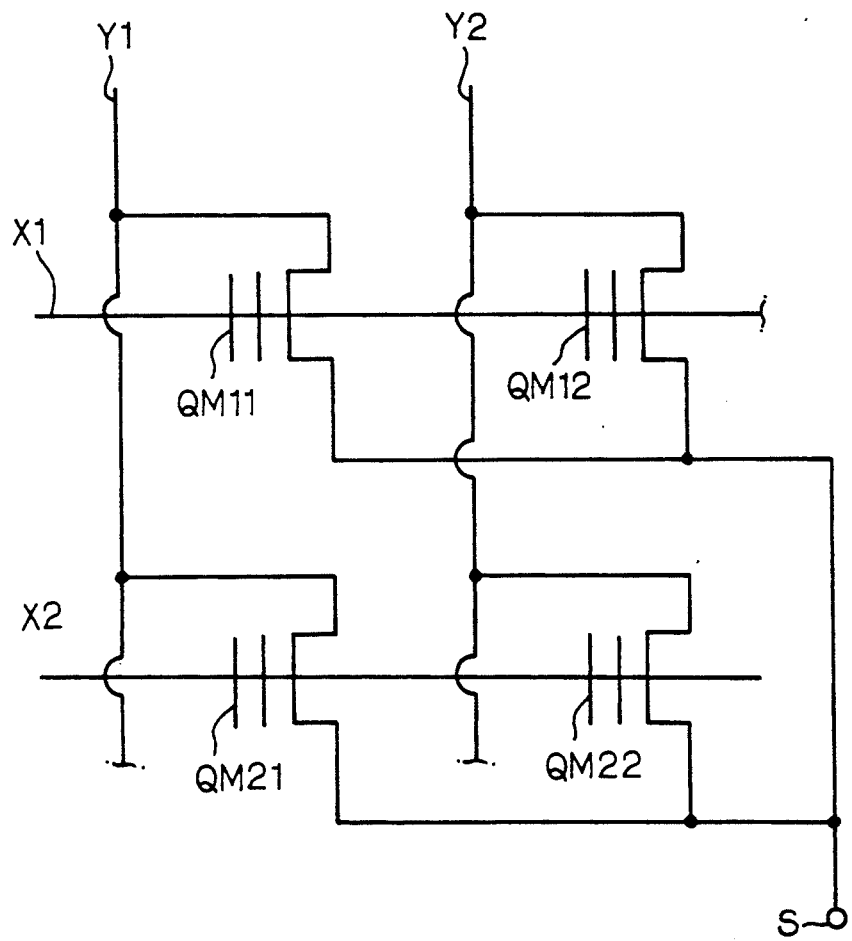
FIG. 3 is an equivalent circuit diagram showing the arrangement of the prior art memory cell array incorporated in the prior art non-volatile semiconductor memory device.

The equivalent circuit diagram of the this instance is similar to that shown in FIG. 3. The control gate electrodes 53i respectively form parts of word lines, and the control gate electrodes 53r also form parts of the other word lines, respectively. When one of the memory transistors is selected from the memory cell array, i.e., either upper or lower memory cell sub-array 52a or 52b in one of the erasing, programming and read-out modes of operation, the word lines are adjusted to predetermined voltage levels described in conjunction with the prior art memory cell array, and an accessed data bit or all of the data bits are written into or read out from the selected memory transistor or concurrently erased from all of the memory transistors.

A particular advantage of the second example is enhancement of the integration density by virtue of the stacked structure. Although the memory cell array of the present example is only constituted by the upper and lower memory cell sub-arrays 52a and 52b, more than two memory cell sub-arrays may be stacked, and the stacked structure of this instance is preferable for fabricating an ultra large scale integration.

Third Example

Turning to FIGS. 12 to 18 of the drawings, yet another memory cell array embodying the present invention is fabricated on a p-type silicon substrate 61 having a resistivity of 13 ohm-cm, and the memory cell array is incorporated in an EEPROM. The EEPROM largely comprises a first bulk transistor 62 serving as a first selecting means, a series combination of second bulk transistors 63 serving as a second selecting means, a memory cell sub-array implemented by a series combination of a floating gate type thin film memory transistors 64 respectively paired with the second bulk transistors 63, and an inter-level insulating film structure 65. Although the memory cell sub-array forms a fart of a memory cell array assisted by peripheral circuits such as address decoders, a sense amplifier unit, an internal boosting circuit and an output buffer circuit, the other memory cell sub-arrays and the peripheral circuits are deleted from FIGS. 12 to 18 for the same of simplicity. Moreover, the inter-level insulating film structure 65 is deleted from FIG. 12, and boxes with diagonal lines are indicative of locations of contact holes formed in the inter-level insulating film structure 65.

The first bulk transistor 62 comprises source and drain regions 62a and 62b doped with arsenic atoms, and the source and drain regions 62a and 62b are spaced from each other by a first channel region 62c. The channel region 62c is covered with a gate insulating film 62d formed of silicon oxide, and is 300 angstroms in thickness. The gate insulating film 62d is overlain by a gate electrode 62e, and the gate electrode 62e forms a part of one of first selecting lines C1 to C2 (see FIG. 19).

The second bulk transistors 63 are coupled in series, and the leftmost second bulk transistor is coupled with the first bulk transistor 62. All of the second bulk transistors 63 are similar in structure to one another, and description is made on the left most second bulk transistor only. The second bulk transistor 63 comprises source/ drain regions 63a, and one of the source/ drain regions 63a is shared between the first bulk transistor 62. The source/ drain regions 63a is doped with arsenic atoms, and are spaced apart from each other by a channel region 63b, and a gate insulating film of silicon oxide covers the channel region 63b. The gate insulating film 63c is 300 angstroms in thickness, and is overlain by a gate electrode 63d of polysilicon doped with phosphorus. The gate electrode 63d is 3000 angstroms in thickness, and the first and second bulk transistors 62 and 63 are covered with a lower inter-level insulating film 65a forming a part of the inter-level insulating film structure 65. The lower inter-level insulating film 65a is deposited to thickness of 2500 angstroms through a chemical vapor deposition technique.

A polysilicon film 64a extends over the lower inter-level insulating film 65a, and is selectively and heavily doped with arsenic atoms. The polysilicon film 64a is 500 angstroms in thickness, and is held in contact with the source/ drain regions 63a of the second bulk transistors 63. The n-type polysilicon film 64a provides source and drain regions for the floating gate type thin film memory transistors 64, and boron atoms are selectively doped into the polysilicon film 64a at $3 \times 10^{16}$ cm$^{-3}$ for providing channel regions for the floating gate type thin film memory transistors 64. The floating gate type thin film memory transistors 64 are respectively paired with the second bulk transistors 63, and the source/ drain regions of the floating gate type thin film transistors 64 are held in contact with the source/ drain regions 63a of the second bulk transistors 63 through contact holes formed in the lower inter-level insulating film 65a. Gate structures 64b are respectively provided on the p-type channel regions of the polysilicon film 64a, and each of the gate structures 64b is similar to that of the floating gate type memory transistor shown in FIG. 4 or 6. In this instance, the gate structure comprises a lower gate insulating film of silicon oxide as thin as 120 angstroms, a floating gate electrode of phosphorus doped polysilicon as thick as 2000 angstroms, an upper gate insulating film of silicon oxide as thin as 200 angstroms, and a control gate electrode of phosphorus doped polysilicon as thick as 3000 angstroms.

An upper inter-level insulating film 65b covers the memory cell sub-array, and is formed of boro-phosphosilicate glass as thick as 1.0 microns. The upper inter-level insulating film 65b forms a part of the inter-level insulating film structure 65, and a contact hole 65c penetrates the inter-level insulating film structure 65. The contact hole exposes the drain region 62b of the first bulk transistor 62, and a bit line 66 of aluminum passes through the contact hole 65c so as to be held in contact with the drain region 62b. The bit line 66 is as thick as 1.0 microns.

Figure 19:
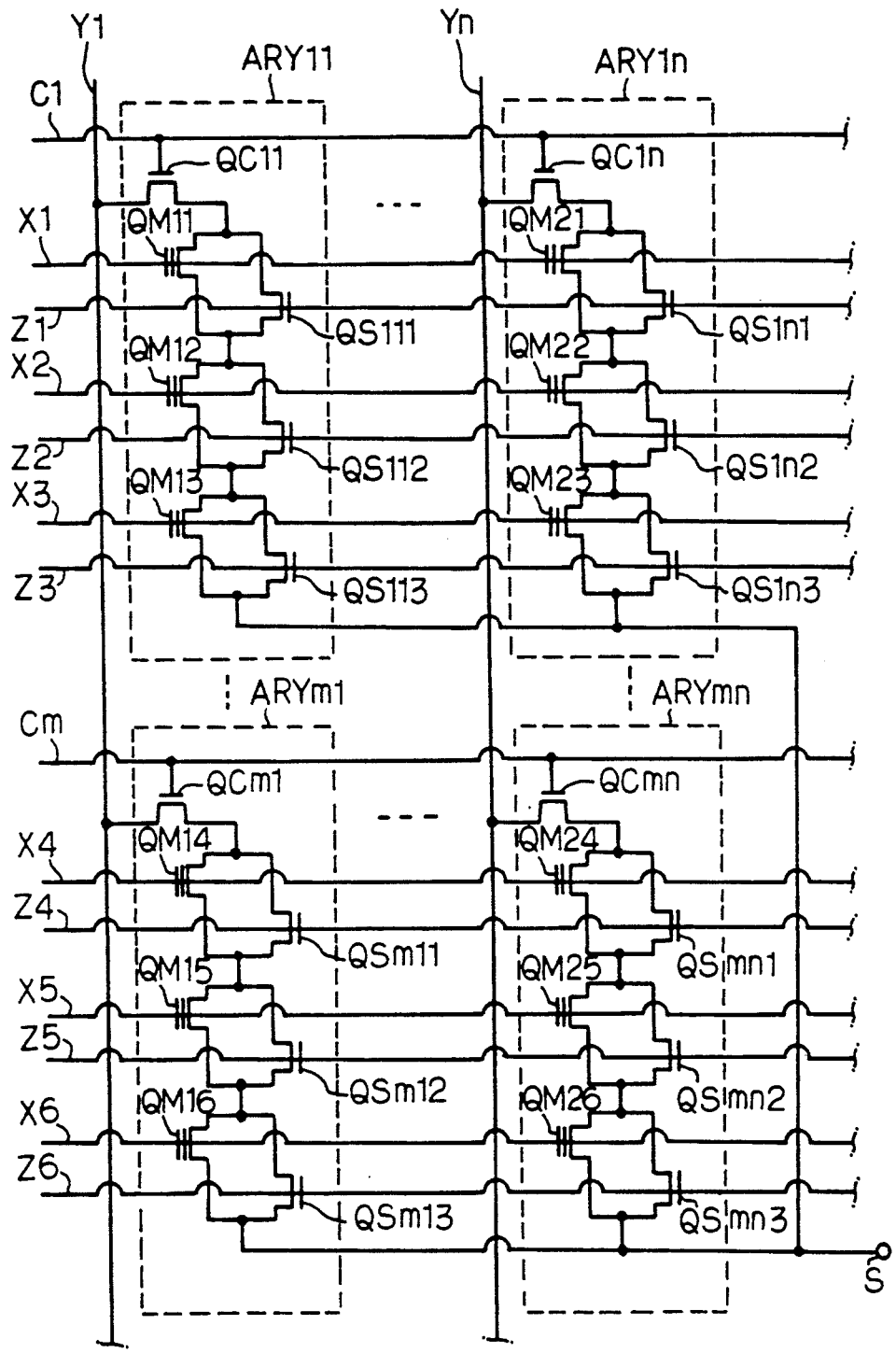
FIG. 19 is an equivalent circuit diagram showing the arrangement of the yet another memory cell array shown in FIGS. 12 to 18.

The memory cell sub-array thus arranged is isolated from the other memory cell sub-arrays by means of a thick field oxide film 67, and an equivalent circuit of this example is illustrated in FIG. 19. The memory cell sub-array shown in FIGS. 12 to 18 is labeled with ARY11, and reference sign Y1, reference sign C1, reference signs Z1, Z2 and Z3 and reference signs X1, X2 and X3 are respectively indicative of the bit line 66, the selecting line 62e, the selecting lines or the gate electrodes 63d and word lines or the control gate electrodes of the gate structures 64b. Other memory cell sub-arrays ARY1n, ARYm1 and ARYmn are further incorporated in the memory cell array, and the selecting lines C1, the word lines X1 to X3 and the selecting lines Z1 to Z3 are shared between the memory cell sub-arrays ARY11 to ARY1n. On the other hand, the bit line Y1 is shared between the memory cell sub-arrays ARY11 to ARYm1, and a selecting line Cm, word lines X4 to X6 and selecting lines Z4 to Z6 are provided for the memory cell sub-arrays ARYm1 to ARYmn. The memory cell sub-arrays ARY1n to ARYmn shares another bit line Yn, and a source line S is shared between all of the memory cell sub-arrays ARY11 to ARYmn. The first bulk transistors are labeled with QC11, QC1n, QCm1 and QCmn, and reference signs QM11 to QM13, QM14 to QM16, QMm21 to QM23 and QM24 to QM26 are respectively assigned to the floating gate type thin film memory transistors of the memory cell sub-arrays ARY11 to ARYmn. Reference signs QS111 to QS113, QS1n1 to QS1n3, QSm11 to QSm13 and QSmn1 to QSmn3 are respectively indicative of the selecting transistors paired with the floating gate type thin film memory transistors QM111 to QMmn3.

Description is hereinbelow made on programming erasing and read-out modes of operation.

Table 1 describes an example of biasing voltage levels in volt on the word lines X1 to X5, the bit lines Y1 and Yn, the selecting lines C1, Cm and Z1 to Z5 and the source line S when the EEPROM enters the programming mode of operation.

TABLE 1

| Selected transistor | Y1 | Yn | c1 | cm | x1 | z1 | x2 | z2 | x3 | z3 | x5 | z5 | S |
|---|---|---|---|---|---|---|---|---|---|---|---|---|---|
| QM11 | 6 | 0 | 10 | 0 | 10 | 0 | 0 | 10 | 0 | 10 | 0 | 0 | 0 |
| QM12 | 6 | 0 | 10 | 0 | 0 | 10 | 10 | 0 | 0 | 10 | 0 | 0 | 0 |
| QM13 | 6 | 0 | 10 | 0 | 0 | 10 | 0 | 10 | 10 | 0 | 0 | 0 | 0 |
| QM21 | 0 | 6 | 10 | 0 | 10 | 0 | 0 | 10 | 0 | 10 | 0 | 0 | 0 |
| QM15 | 6 | 0 | 0 | 10 | 0 | 0 | 0 | 0 | 0 | 0 | 10 | 0 | 0 |
| QM25 | 0 | 6 | 0 | 10 | 0 | 0 | 0 | 0 | 0 | 0 | 10 | 0 | 0 |

When the EEPROM enters a programming mode, a write-in operation is selectively carried out on the floating gate type thin film memory transistors QM11 to QM26, and the word "write-in operation" means injection of electrons into the floating gate electrode. After the write-in operation, the threshold level of the floating gate type thin film memory transistor is increased. In this instance, while carrying out the write-in operation, current is supplied to the associated bit line, and hot electrons are injected into the floating gate electrode. For example, if the floating gate type thin film memory transistor QM11 is selected, high voltage level of 6 volts is supplied from the associated bit line Y1 through the selecting transistor QC11 to the drain electrode of the memory transistor QM11, and high voltage level 10 volts is supplied from the word line X1 to the control gate electrode thereof. However, the selecting line Z1 supplies zero volt to the gate electrode of the selecting transistor QS111 paired with the memory transistor QM11, and the selecting transistor QS111 turns off. As a result, any bypassing current path is not established for the memory transistor QM11, and current from the bit line Y1 flows through the drain-to-source current path of the memory transistor QM11.

On the other hand, the control gate electrodes of the other floating gate type thin film memory transistors QM12 and QM13 are fixed to zero volt by means of the word lines X2 and X3. However, the high voltage level of 10 volts is supplied from the selecting lines Z2 and Z3 to the gate electrodes of the selecting transistors QS112 and QS113, and, as a result, the selecting transistors QS112 and QS113 turn on. The selecting transistors QS112 and QS113 provide current path from the memory transistor QM11 to the source line S of the ground voltage level. The current flows from the bit line Y1 to the source line S, and hot electrons are produced in the channel region of the memory transistor QM11 so that electrons are injected into the floating gate electrode. Since the control gate electrodes of the memory transistors QM12 and QM13 are applied with zero volt, only a negligible amount of differential voltage takes place between the source region and the drain region.

When the write-in operation is carried out on the memory transistor QM12, the high voltage level of 10 volts is supplied from the selecting line C1 to the gate electrode of the selecting transistor QC11, and the bit line supplies the high voltage level of 6 volts through the selecting transistor QC11 to the drain region of the memory transistor QM12. Moreover, zero volt is supplied from the word lines X1 and X3 to the control gate electrodes of the other memory transistors QM11 and QM13, and the gate electrodes of the other first selecting transistors QS111 and QS113 are supplied from the selecting lines Z1 and Z3 with 10 volts. Finally, the control gate of the selected memory transistor QM12 is supplied from the word line X2 with 10 volts, and the gate electrode of the selecting transistor QS112 paired with the selected memory transistor is supplied from the selecting line Z2 with zero volt. In this situation, the first selecting transistor QS112 blocks current path bypassing the selected memory transistor QM12, but the other selecting transistors QS111 and QS113 form a bypass way for the non-selected memory transistors QM11 and QM13, and, for this reason, current flows from the bit line Y1 through the source-to-drain current path of the selected memory transistor QM12 to the source line S. As a result, hot electrons are produced at the channel region, and are injected into the floating gate electrode of the selected memory transistor QM12.

As described hereinbefore, each bit line Y1 or Yn is shared between a plurality of memory cell sub-arrays ARY11 to ARYm1 or ARY1n to ARYmn, and non-selected memory cell sub-arrays should be isolated from the selected bit line. For this reason, when the floating gate type thin film memory transistor QM12 is selected, the word lines X4 to X6, the selecting lines Z4 to Z6 and the selecting line Cm is maintained at zero volt, and no channel current flows through the memory transistors QM14, QM15 and QM16. The selection between the memory cell sub-arrays in different columns is achieved by controlling the voltage levels on the bit lines Y1 to Yn. Namely, if the floating gate type thin film transistor QM21 is selected, the bit line Y1 is changed to zero volt so that any differential voltage tales place between the source region and the drain region of any one of the floating gate type thin film transistor in the memory cell sub-arrays ARY11 to ARYm1. However, the bit line Yn supplies current to the selected floating gate type thin film transistor QM21 as similar to the selected memory transistor QM11 or QM12 as described hereinbefore.

When the EEPROM enters the erasing mode of operation, the selecting lines Y1 to Yn, the word lines X1 to X6 and the selecting lines Z1 to Z6 are controlled as shown in Table 2 and Table 3. The unit for the tables is volt (V). When the EEPROM enters the erasing mode of operation, electrons are evacuated from a floating gate electrode for decreasing the threshold level of the floating gate type thin film memory transistors. In this instance, the erasing operation is carried out by using either source or bit line S or Y1/Yn. Table 2 illustrates the voltage levels when the erasing operation is carried out by using the source line S, and voltage levels in Table 3 are used in the erasing operation from the bit line Y1/ Yn. Moreover, a concurrent erasing and a word erasing are selective in the erasing mode. In the concurrent erasing, the EEPROM erases all of the floating gate type thin film memory transistors QM11 to QM26. On the other hand, a row of the memory transistors coupled with one of the word lines X1 to X6 are concurrently erased in the word erasing operation.

TABLE 2

| Erasing Mode | Selectivity | Y1 | Y2 | c1 | c2 | x1 | z1 | x2 | z2 | x3 | z3 | x4 to x6 | z4 to z6 | S |
|---|---|---|---|---|---|---|---|---|---|---|---|---|---|---|
| Concurrent Erasing | No | open | open | 0 | 0 | 0 | 20 | 0 | 20 | 0 | 20 | 0 | 20 | 20 |
| Word Erasing | Word Line X1 | open | open | 0 | 0 | 0 | 20 | 20 | 20 | 20 | 20 | 20 | 20 | 20 |
| | Word Line X2 | open | open | 0 | 0 | 20 | 20 | 0 | 20 | 20 | 20 | 20 | 20 | 20 |
| | Word Line X3 | open | open | 0 | 0 | 20 | 20 | 20 | 20 | 0 | 20 | 20 | 20 | 20 |

TABLE 3

| Erasing Mode | Selectivity | Y1 | Y2 | c1 | c2 | x1 | z1 | x2 | z2 | x3 | z3 | x4 to x6 | z4 to z6 | S |
|---|---|---|---|---|---|---|---|---|---|---|---|---|---|---|
| Concurrent Erasing | No | 20 | 20 | 20 | 20 | 0 | 20 | 0 | 20 | 0 | 20 | 0 | 20 | open |
| Word Erasing | Word Line X1 | 20 | 20 | 20 | 0 | 0 | 20 | 20 | 20 | 20 | 20 | 20 | 20 | open |
| | Word Line X2 | 20 | 20 | 20 | 0 | 20 | 20 | 0 | 20 | 20 | 20 | 20 | 20 | open |

TABLE 3-continued

| Erasing Mode | Selectivity | Y1 | Y2 | c1 | c2 | x1 | z1 | x2 | z2 | x3 | z3 | x4 to x6 | z4 to z6 | S |
|---|---|---|---|---|---|---|---|---|---|---|---|---|---|---|
| | Word Line X3 | 20 | 20 | 20 | 0 | 20 | 20 | 20 | 20 | 0 | 20 | 20 | 20 | open |

In this instance, the erasing operation is carried out by using Fowler-Nordheim tunneling current. When extremely high voltage level of 20 volts is applied to either of or both of the source/ drain regions of a floating gate type thin film memory transistor and the control gate electrode is fixed to zero volt, electric field across the lower gate insulating film becomes strong, and the Fowler-Nordheim tunneling phenomenon takes place across the lower gate insulating film, thereby evacuating electrons from the floating gate electrode. As shown in Tables 2 and 3, the erasing can be Carried out from the bit line or the source line. First, erasing from the source line S is described hereinbelow.

When the concurrent erasing is selected, there is no selectivity on the floating gate type thin film memory transistors QM11 to QM26. In this erasing sequence, all of the word lines X1 to X6 are fixed to zero volt and all of the selecting lines Z1 to Z6 are fixed to 20 volts. If the extremely high voltage level of 20 volts is applied to the source line S, the selecting lines C1 and Cm are fixed to zero. However, if the bit lines Y1 to Yn supplies the extremely high voltage level of 20 volts, the selecting lines C1 to Cm are applied with 20 volts so that allowing the selecting transistors QC11 to QCmn to turn on. Since the bit lines Y1 to Yn or the source line S is opened, the electrons are evacuated from the floating gate electrodes to the bit lines Y1 to Yn or the source line S.

When the word erasing is selected, only one selected word line is fixed to zero volt, and the other word lines and all of the selecting lines Z1 to Z6 are fixed to 20 volts. In case of the erasing from the source line S, the selecting lines C1 and Cm are fixed to zero volt so that the bit lines Y1 and Yn are blocked from the memory cell sub-arrays ARY11 to ARYmn. The source line S is applied with 20 volts, electric field across the lower gate insulating films of the selected memory transistors becomes strong, and the Fowler-Nordheim tunneling phenomenon take place. However, only extremely weak electric field takes place across the lower gate insulating films of the non-selected memory transistors due to the associated selecting transistors in the on-state, and the electric field too weak to evacuated the accumulated hot electrons. For this reason, only the memory transistors coupled with the selected word line are erased. In case of the erasing from the bit lines, the selecting lines C1 to Cm is selectively supplied with the extremely high voltage level, and the source line S is opened. As a result, the extremely high voltage level of 20 volts is applied to only one row of memory cell sub-arrays, and a row of floating gate type thin film memory transistors are erased as similar to the erasing from the source line S.

Figure 20:
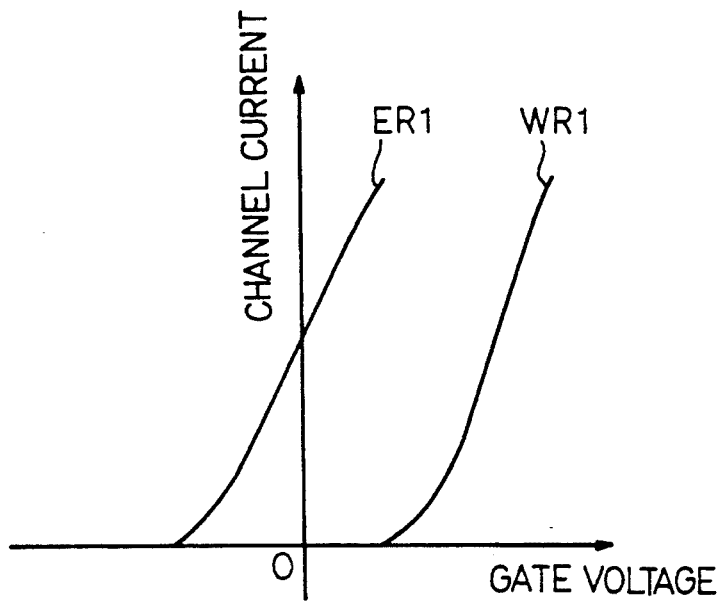
FIG. 20 is a graph showing channel current in terms of voltage level at the control gate electrode of the floating gate type thin film transistor.
Figure 21:
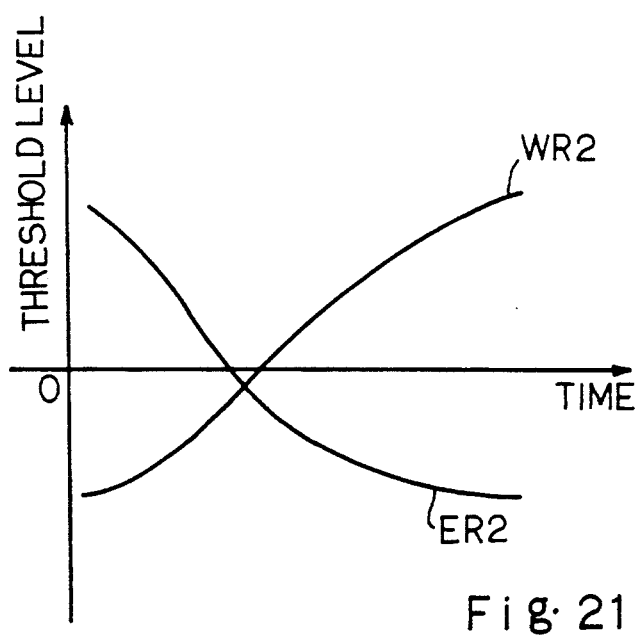
FIG. 21 is a graph showing programming and erase characteristics of the floating gate type thin film memory transistor.

FIG. 20 shows channel current in therm of voltage level applied to the control gate electrode of the floating gate type thin film memory transistor according to the present invention, and plots ER1 and WR1 stand for the erased state and the write-in state, respectively. FIG. 21 shows programming and erase characteristics of the floating gate type thin film memory transistor in terms of time, and plots ER2 and WR2 are respectively indicative of the threshold level varied in the erasing mode and the threshold level in the programming mode. The time scale or the abscissa is non-linear, and is varied from microsecond to second. During the write-in operation, the threshold voltage level is elevated due to the electrons injected into the floating gate electrode. For this reason, even if the control gate electrode is applied with zero volt, no channel current flows. However, if the floating gate type thin film memory transistor is erased, the threshold voltage level is decreased, because the electrons are evacuated from the floating gate electrode. As a result, even if the control gate electrode is applied with zero volt, channel current flows. The threshold levels of the floating gate type thin film memory transistors are varied with time as indicated by plots ER2 and WR2.

Subsequently, if the EEPROM enters the read-out mode, the selecting lines C1 to Cm, the word lines X1 to X6 and the selecting lines Z1 to Z6 are regulated to values shown in Table 4. The unit for the values is volt (V).

TABLE 4

| Selected transistor | Y1 | Y2 | c1 | c2 | x1 | z1 | x2 | z2 | x3 | z3 | x4 to x6 | z4 to z6 | S |
|---|---|---|---|---|---|---|---|---|---|---|---|---|---|
| QM11 | 1 | 0 | 5 | 0 | 0 | 0 | 0 | 5 | 0 | 5 | 0 | 0 | 0 |
| QM12 | 1 | 0 | 5 | 0 | 0 | 5 | 0 | 0 | 0 | 5 | 0 | 0 | 0 |
| QM13 | 1 | 0 | 5 | 0 | 0 | 5 | 0 | 5 | 0 | 0 | 0 | 0 | 0 |
| QM21 | 0 | 1 | 5 | 0 | 0 | 0 | 0 | 5 | 0 | 5 | 0 | 0 | 0 |
| QM11 & QM21 | 1 | 1 | 5 | 0 | 0 | 0 | 0 | 5 | 0 | 5 | 0 | 0 | 0 |

Description is made on the assumption that the memory transistor QM21 is the selected from the memory cell array. The control gate electrode of the memory transistor QM21 is applied from the word line X1 with zero volt, and the gate electrode of the first selecting transistor QS1n1 paired with the selected memory transistor QM21 is applied from the selecting line Z1 with zero volt. The zero volt on the selecting line Z1 causes the selecting transistor QS1n1 to turn off, and only the channel region of the memory transistor QM21 serves as a current path. The selecting lines Z2 and Z3 of 5 volts cause the other selecting transistors QS1n2 and QS1n3 of the sub-array ARY1n to turn on so that the selecting transistors QS1n2 and QS1n3 serve as transfer gates. For this reason, current from the bit line Y2 reaches the drain region of the selected memory transistor QM21, and discharge current path is established from the source region of the selected memory transistor QM21 to the source line S. However, the other word lines X2 and X3 are regulated to zero or 5 volts, because the associated selecting transistors QS1n2 and QS1n3 bypasses the current. If the selected memory transistor QM21 is in the write-in state and, accordingly, the threshold level is not less than zero volt, zero volt on the control gate electrode of the selected memory transistor QM21 blocks the current from the bit line Y2, and no current flows into the source line S. On the other hand, if the selected memory transistor QM21 is in the erased state and, accordingly, the threshold level is lower than zero volt, current flows from the bit line Y2 through the selected memory transistor QM21 to the source line S. Thus, the erased state and the write-in state of the selected memory transistor are corresponding to the "presence" and "absence" of the current from the bit line, and a sense amplifier circuit (not shown) for producing an output data signal indicative of the state of the selected floating gate type thin film memory transistor.

Additionally, to the aforesaid read-out mode, if the bit lines Y1 to Yn are respectively coupled with sense amplifier circuits (not shown), currents on the respective bit lines Y1 to Yn are indicative of the states of the floating gate type thin film memory transistors coupled with a selected word line. By the way, the selecting lines Y1 to Yn are advantageous as follows. First, parasitic leakage current flowing through the non-selected memory transistors in the write-in is blocked by the selecting transistors QC11 to QCmn, and, accordingly, enhances the efficiency of the current flowing through the selected bit line. As a result, variable range of the threshold voltage level of the memory transistors becomes wide between the write-in and the erasing. Second, it is possible to couple the bit line with the drain diffused regions of the second selecting transistors of the respective transistor groups, and, for this reason, the capacitance coupled with the bit line becomes smaller.

As described hereinbefore, the EEPROM equipped with the floating gate type thin film memory transistors according to the present invention achieves the following advantages.

(1) While carrying out a selective write-in, it is not necessary to prepare an intermediate voltage level, and only two voltage levels are necessary. As a result, the design work on the peripheral circuits as well as the control circuit becomes easy.

(2) Excess write-in state and excessively erased state never take place. This means that there is not any limitation on the lower limit and the upper limit of the threshold voltage level of the memory transistors, and the swingable range of the threshold level is wider than the prior art example. For this reason, the arrangement of the peripheral circuits, more particularly, of the control circuit in the write-in system becomes simple. Even if difference in write-in characteristics takes place due to fluctuation in fabrication process of the memory transistor, the production yield is kept high because of the wide allowable range.

(3) Injection of hot electrons is available for the write-in operation. Electric field in the lower gate insulating film of each non-selected memory transistor in the write-in mode is made smaller than that in the erasing mode. This results in that non-selected memory transistors coupled with the same word line is prevented from erroneous write-in state. Moreover, since the threshold level of the memory transistor in the write-in state allows the voltage level on the control gate electrode to be zero volt, the voltage level at the control gate electrode in the write-in is low, the decoder circuits (not shown) can be fabricated from standard transistors.

(4) The write-in operation does not need the Fowler-Nordheim tunneling current, the erasing operation is carried out with not only the F-N electron tunneling but also avalanche break-down and radiation of ultra-violet light, and, for this reason, relatively thick silicon oxide film of, for example, 130 micron thick is available for the lower gate insulating film of the memory transistor. As a result, the thickness of the lower gate insulating films is easily controllable, and the production yield is high.

(5) Since the drain voltage level in the write-in operation is low and, accordingly, the electric field across the lower gate insulating film is weak, erroneous erasing of the data bit hardly takes place. For this reason, the floating gate type thin film memory transistors are erasable at random.

(6) A word erasing and a word write-in are possible. This means that data information is rewriteable without erasing. This results in that time period for the programming is drastically shrunk.

(7) Since the floating gate type thin film memory transistors are provided on the selecting transistors paired therewith, each memory cell occupies a small amount of real estate. Moreover, a plurality of pairs are coupled in series, and the number of bit line contact holes is decreased. If the same design rules are employed, the chip size is decreased.

Fourth Example

Figure 22:
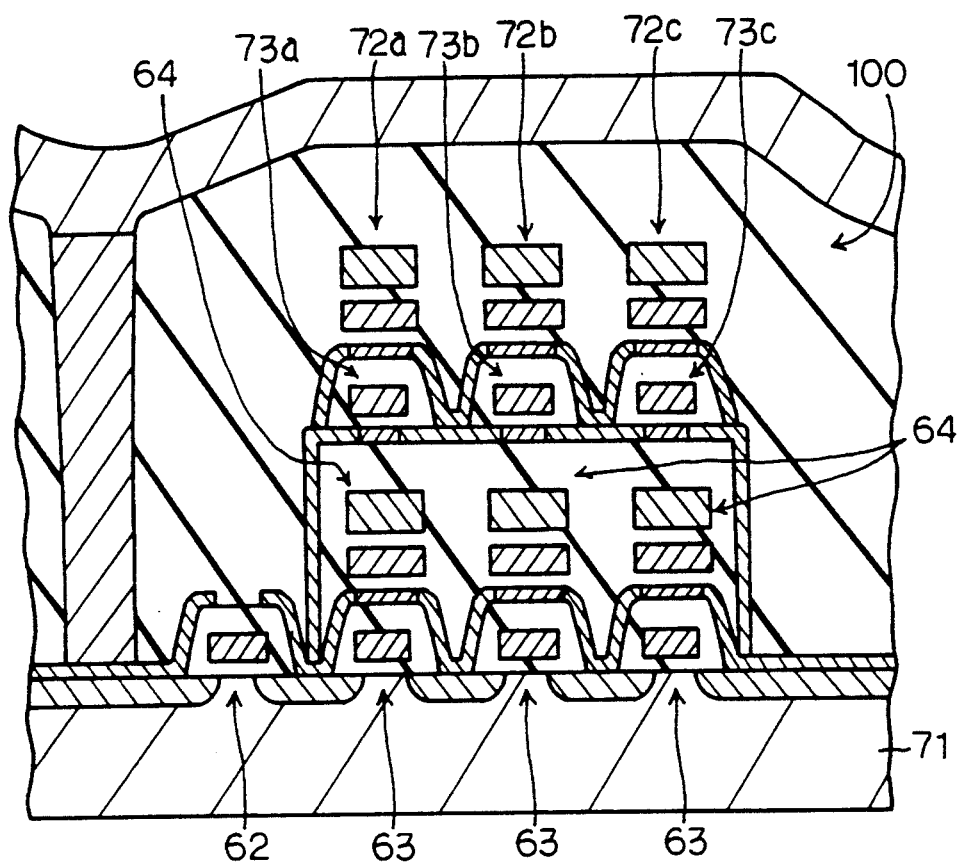
FIG. 22 is a cross sectional view showing still another memory cell array according to the present invention.

Turning to FIG. 22 of the drawings, still another memory cell sub-array according to the present invention is fabricated on a p-type silicon substrate 71, and forms a part of a memory cell array shown in FIG. 23. Floating gate type thin film memory transistors 72a, 72b and 72c are stacked over and paired with thin film selecting transistors 73a, 73b and 73c, respectively, and the thin film selecting transistors 73a, 73b and 73c are located over the floating gate type thin film memory transistors 64 paired with the selecting transistors 63. For this reason, six floating gate type thin film memory transistors 64, 72a to 72c are incorporated in each memory cell sub-array ARY100; however, the circuit arrangement of each memory cell sub-array 100 is analogous from the memory cell sub-arrays ARY11 to ARYmn. Reference signs C1 to Cm, reference signs X11 to X62 and reference signs Z11 to Z62 are respectively indicative of selecting lines for the memory cell sub-arrays, word lines and selecting lines for the floating gate type thin film memory transistors. However, no further description is incorporated hereinbelow.

The memory cell array shown in FIGS. 22 and 23 is desirable for increase of the memory transistors without sacrifice of the semiconductor ship size.

Although particular embodiments of the present invention have been shown and described, it will be obvious to those skilled in the art that various changes and modifications may be made without departing from the spirit and scope of the present invention. For example, the floating gate type thin film memory transistor may be incorporated in an EPROM erasable with ultra-violet radiation. Moreover, the floating gate type thin film memory transistors paired with the thin film selecting transistors are stacked into a multi-level structure including more than two layers of the memory cell sub-arrays.

What is claimed is:

1. A non-volatile semiconductor memory device fabricated on a semiconductor substrate, comprising:
   a) a first selecting means implemented by a first bulk transistor comprising a-1) source and drain regions formed in surface portions of said semiconductor substrate, and spaced from each other by a first channel region, a-2) a first gate insulating film formed on said first channel region, and a-3) a first gate electrode formed on said first gate insulating film;

b) a second selecting means coupled with one of said source and drain regions of said first bulk transistor, and implemented by a plurality of second bulk transistors coupled in series, each of said plurality of second bulk transistors comprising b-1) source and drain regions formed in other surface portions of said semiconductor substrate, and spaced from each other by a second channel region, b-2) a second gate insulating film formed on said second channel region, and b-3) a second gate electrode formed on said second gate insulating film, a-4) a second gate insulating film;

c) a first inter-level insulating film covering said first selecting means and said second selecting means;

d) a lower memory cell sub-array fabricated on said first inter-level insulating film, and implemented by a plurality of floating gate type first thin film memory transistors coupled in series and respectively paired with said plurality of second bulk transistors, each of said floating gate type first thin film transistors comprising d-1) source and drain regions formed in a first semiconductor film extending over said first inter-level insulating film, and spaced apart from each other by a third channel region, said source and drain regions of said floating gate type thin film memory transistor being respectively held in contact with said source and drain regions of second bulk transistor paired therewith, d-2) a third gate insulating film covering said third channel region, d-3) a first floating gate electrode formed on said third gate insulating film, d-4) a fourth gate insulating film covering said first floating gate electrode, and d-5) a first control gate electrode formed on said fourth gate insulating film;

e) a second inter-level insulating film covering said lower memory cell sub-array;

f) a third selecting means coupled with said one of said source and drain regions of said first bulk transistor, and implemented by a plurality of thin film selecting transistors coupled in series, each of said plurality of thin film selecting transistors comprising f-1) source and drain regions formed in a second semiconductor film extending on said second inter-level insulating film, and spaced apart from each other by a fourth channel region, f-2) a fifth gate insulating film formed on said fourth channel region, and f-3) a third gate electrode formed on said fifth gate insulating film;

g) a third inter-level insulating film covering said third selecting means;

h) an upper memory cell sub-array fabricated on said third inter-level insulating film, and implemented by a plurality of floating gate type second thin film memory transistors coupled in series and respectively paired with said plurality of thin film selecting transistors, each of said floating gate type second thin film transistors comprising h-1) source and drain regions formed in a third semiconductor film extending over said third inter-level insulating film, and spaced apart from each other by a fifth channel region, said source and drain regions of said floating gate type second thin film memory transistor being respectively held in contact with said source and drain regions of said thin film selecting transistor paired therewith, h-2) a sixth gate insulating film covering said fifth channel region, h-3) a second floating gate electrode formed on said sixth gate insulating film, h-4) a seventh gate insulating film covering said second floating gate electrode, and h-5) a second control gate electrode formed on said seventh gate insulating film;

i) a fourth inter-level insulating film covering said upper memory cell sub-array, at least one contact hole projecting through said first, second, third and fourth inter-level insulating films for exposing the other of said source and drain regions of said first bulk transistor; and j) at least one bit line extending on said fourth inter-level insulating film, and penetrating said at least one contact hole so as to be held in contact with said other of said source and drain regions of said first bulk transistor.

* * * * *